United States Patent
Watabe et al.

(10) Patent No.: US 12,125,729 B2
(45) Date of Patent: Oct. 22, 2024

(54) SUBSTRATE STORAGE APPARATUS AND SUBSTRATE PROCESSING SYSTEM

(71) Applicant: Kioxia Corporation, Tokyo (JP)

(72) Inventors: Kohei Watabe, Yokkaichi Mie (JP); Hiroyuki Ideyama, Yokkaichi Mie (JP); Yuya Matsuda, Mie Mie (JP)

(73) Assignee: Kioxia Corporation, Tokyo (JP)

( * ) Notice: Subject to any disclaimer, the term of this patent is extended or adjusted under 35 U.S.C. 154(b) by 289 days.

(21) Appl. No.: 17/654,744

(22) Filed: Mar. 14, 2022

(65) Prior Publication Data

US 2023/0091759 A1 Mar. 23, 2023

(30) Foreign Application Priority Data

Sep. 17, 2021 (JP) .................. 2021-152417

(51) Int. Cl.
*H01L 21/677* (2006.01)
*B65G 47/90* (2006.01)
*H01L 21/687* (2006.01)

(52) U.S. Cl.
CPC ........ *H01L 21/67769* (2013.01); *B65G 47/90* (2013.01); *H01L 21/67766* (2013.01); *H01L 21/68707* (2013.01)

(58) Field of Classification Search
CPC ........... H01L 21/67017; H01L 21/6732; H01L 21/67766
See application file for complete search history.

(56) References Cited

U.S. PATENT DOCUMENTS

| | | | |
|---|---|---|---|
| 6,899,145 B2 * | 5/2005 | Aggarwal | H01L 21/67393 141/69 |
| 10,777,437 B2 | 9/2020 | Fukasawa | |
| 10,937,677 B2 * | 3/2021 | Woo | B08B 9/0321 |
| 2016/0284580 A1 * | 9/2016 | Woo | H01L 21/67393 |
| 2020/0135521 A1 | 4/2020 | Reuter et al. | |
| 2021/0057251 A1 * | 2/2021 | Matsuoka | H01L 21/67742 |

FOREIGN PATENT DOCUMENTS

| | | |
|---|---|---|
| JP | 2000-3894 A | 1/2000 |
| JP | 2017-11150 A | 1/2017 |

* cited by examiner

*Primary Examiner* — Jason K Niesz
(74) *Attorney, Agent, or Firm* — Finnegan, Henderson, Farabow, Garrett & Dunner, LLP

(57) ABSTRACT

According to one embodiment, there is provided a substrate storage apparatus including a storage unit and an exhaust unit. The storage unit includes a plurality of plates. The exhaust unit includes an exhaust passage and a wall portion. The exhaust passage communicates with an exhaust port. The wall portion intervenes between the storage unit and the exhaust passage. The wall portion includes a plurality of slit holes. The plurality of plates protrude inward from a cabinet in the storage unit. Plates among the plurality of plates are capable of mounting a substrate. The plurality of plates are arrayed in a vertical direction. The plurality of slit holes are arrayed in the vertical direction to correspond to the plurality of plates. Each of the plurality of slit holes extends in a horizontal direction and penetrates the wall portion.

12 Claims, 22 Drawing Sheets

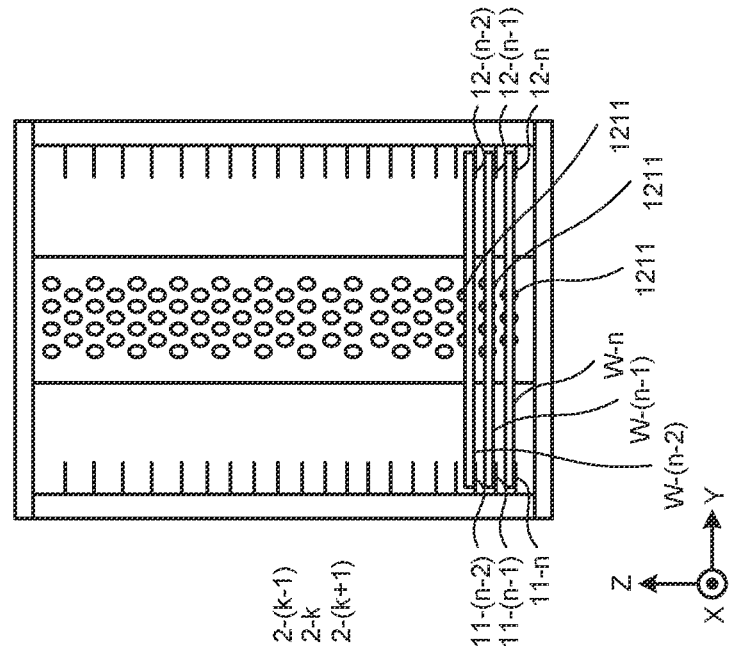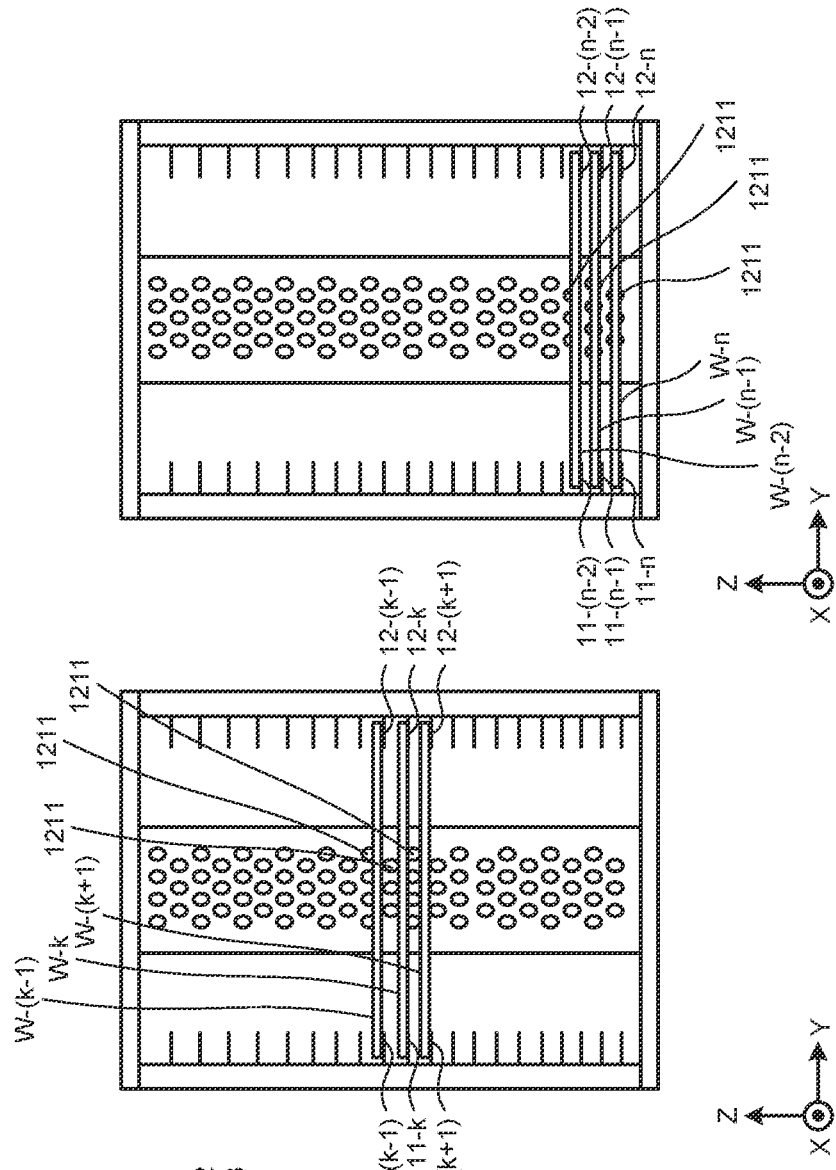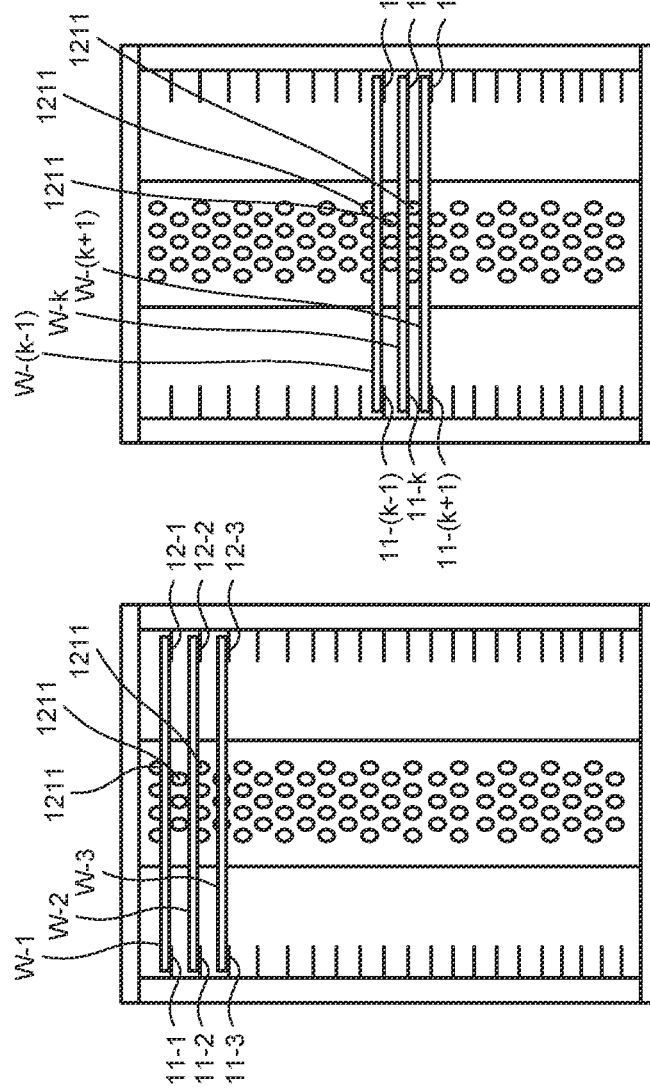

SUBSTRATE STORAGE APPARATUS AND SUBSTRATE PROCESSING SYSTEM

CROSS-REFERENCE TO RELATED APPLICATIONS

This application is based upon and claims the benefit of priority from Japanese Patent Application No. 2021-152417, filed on Sep. 17, 2021; the entire contents of which are incorporated herein by reference.

FIELD

Embodiments described herein relate generally to a substrate storage apparatus and a substrate processing system.

BACKGROUND

In a manufacturing process of a semiconductor device, a substrate is loaded into a substrate processing apparatus, is processed by the substrate processing apparatus, and thereafter, is unloaded from the substrate processing apparatus. In the case of sequentially processing a plurality of substrates by the substrate processing apparatus, the plurality of substrates are sometimes loaded into and unloaded from the substrate processing apparatus while being stored in the substrate storage apparatus. Desirably, the plurality of substrates stored in the substrate storage apparatus are kept in an appropriate state.

BRIEF DESCRIPTION OF THE DRAWINGS

FIGS. 12A to 12C are front views illustrating an operation of the substrate storage apparatus according to the second embodiment;

DETAILED DESCRIPTION

In general, according to one embodiment, there is provided a substrate storage apparatus including a storage unit and an exhaust unit. The storage unit includes a plurality of plates. The exhaust unit includes an exhaust passage and a wall portion. The exhaust passage communicates with an exhaust port. The wall portion intervenes between the storage unit and the exhaust passage. The wall portion includes a plurality of slit holes. The plurality of plates protrude inward from a cabinet in the storage unit. Plates among the plurality of plates are capable of mounting a substrate. The plurality of plates are arrayed in a vertical direction. The plurality of slit holes are arrayed in the vertical direction to correspond to the plurality of plates. Each of the plurality of slit holes extends in a horizontal direction and penetrates the wall portion.

Exemplary embodiments of a substrate storage apparatus will be explained below in detail with reference to the accompanying drawings. The present invention is not limited to the following embodiments.

First Embodiment

Figure 1:
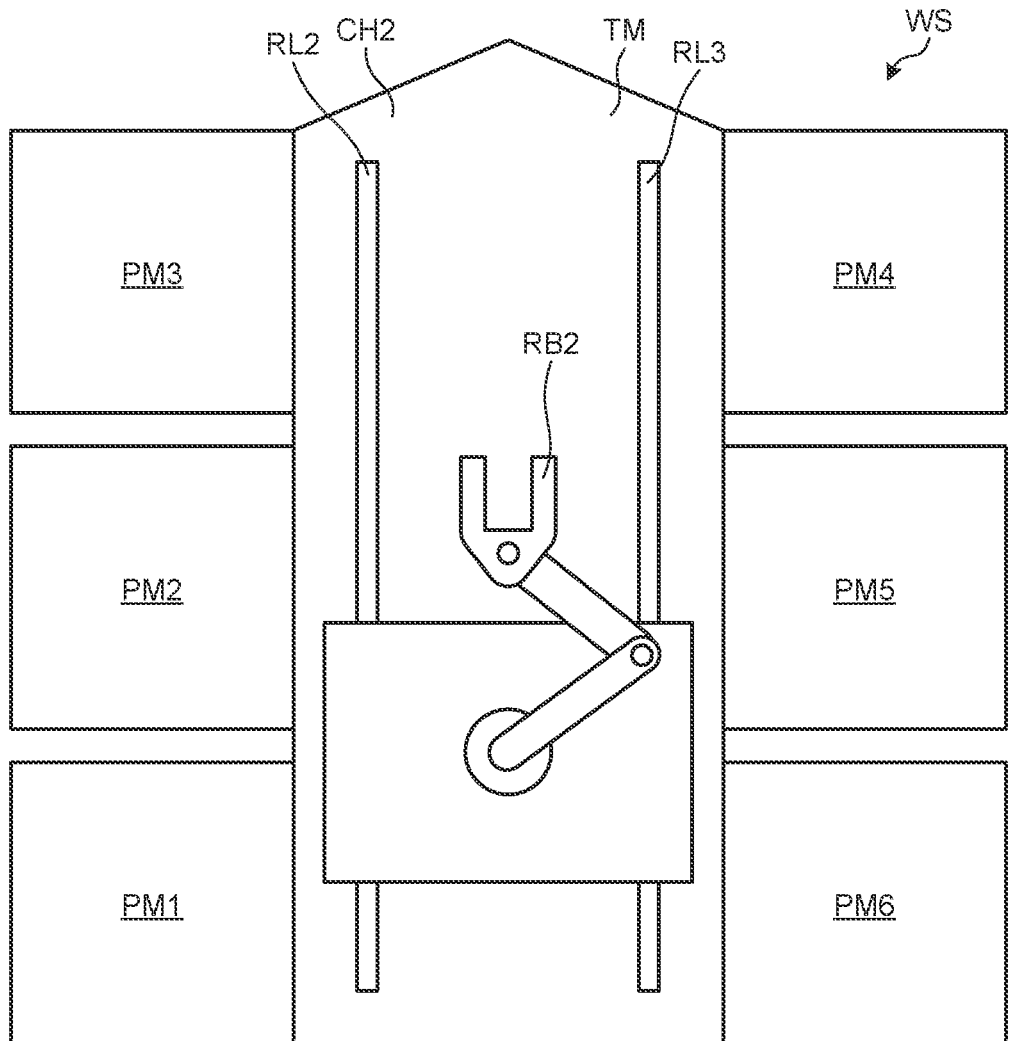
FIG. 1 is a view illustrating a schematic configuration of a substrate processing system including a substrate storage apparatus according to a first embodiment.

A substrate storage apparatus according to a first embodiment is capable of storing a plurality of substrates, and is devised in order to uniformly clean the plurality of substrates stored therein. Specifically, the substrate storage apparatus is applied to a substrate processing system WS as illustrated in FIG. 1. FIG. 1 is a view illustrating a schematic configuration of the substrate processing system WS including the substrate storage apparatus 1. Hereinafter, a vertical direction is defined as a Z-direction, and two directions orthogonal to each other in a plane perpendicular to the Z-direction are defined as an X-direction and a Y-direction.

The substrate processing system WS includes: a plurality of load ports LP1 to LP3; a loader module LM; a load lock module LL1; a load lock module LL2; a transfer module TM; and a plurality of process modules PM1 to PM6. The loader module LM includes the substrate storage apparatus 1.

The loader module LM is disposed between the plurality of load ports LP1 to LP3 and the load lock modules LL1 and LL2. The substrate storage apparatus 1 is disposed in a body of the loader module LM. The transfer module TM is disposed between the load lock modules LL1 and LL2 and the plurality of process modules PM1 to PM6.

A FOUP (Front Opening Unified Pod) FP is mounted on each of the plurality of load ports LP1 to LP3. The FOUP FP is capable of housing up to two lots of substrates W whose number is n or less per lot. n is an integer of two or more.

The loader module LM further includes a body portion BD, a conveyance chamber CH1, a conveyance robot RB1, and a rail RL1 in addition to the substrate storage apparatus 1. The body portion BD is a box-shaped cabinet, in which the conveyance chamber CH1 is formed as an inner space. The inside of the conveyance chamber CH1 is set to an atmospheric pressure environment. The rail RL1 extends in the Y-direction so as to include a Y-position of the substrate storage apparatus 1 in the conveyance chamber CH1. The conveyance robot RB1 is configured to be movable in the Y-direction along the rail RL1. The plurality of load ports LP1 to LP3 are arrayed in the Y-direction on a +X-side of the conveyance robot RB1. The load lock module LL1 and the load lock module LL2 are arrayed in the Y-direction on a −X-side of the conveyance robot RB1.

The substrate storage apparatus 1 is disposed at a position where the substrates W are loadable/unloadable by the conveyance robot RB1 in the body portion BD of the loader module LM. A space in the substrate storage apparatus 1, in which the substrates W are to be stored, is caused to communicate with the conveyance chamber CH1.

The load lock module LL1 includes a chamber CH3 for pre-depressurization. The load lock module LL2 includes a chamber CH4 for pre-depressurization.

The transfer module TM includes a conveyance chamber CH2, a conveyance robot RB2, and rails RL2 and RL3. The conveyance chamber CH2 is set to a depressurized environment. In the inside of the conveyance chamber CH2, each of the rails RL2 and RL3 extends in the X-direction, and the conveyance robot RB2 is configured to be movable in the X-direction along the rails RL2 and RL3.

The plurality of process modules PM1 to PM3 are arrayed in the X-direction along a −Y side of the transfer module TM. The plurality of process modules PM4 to PM6 are arrayed in the X-direction along a +Y side of the transfer module TM. Each of the process modules PM1 to PM6 is of a sheet feeding-type, and is capable of processing the substrates W one by one. Processing performed by each of the process modules PM1 to PM6 is, for example, plasma etching, deposition, heat treatment, and the like.

Figure 2:
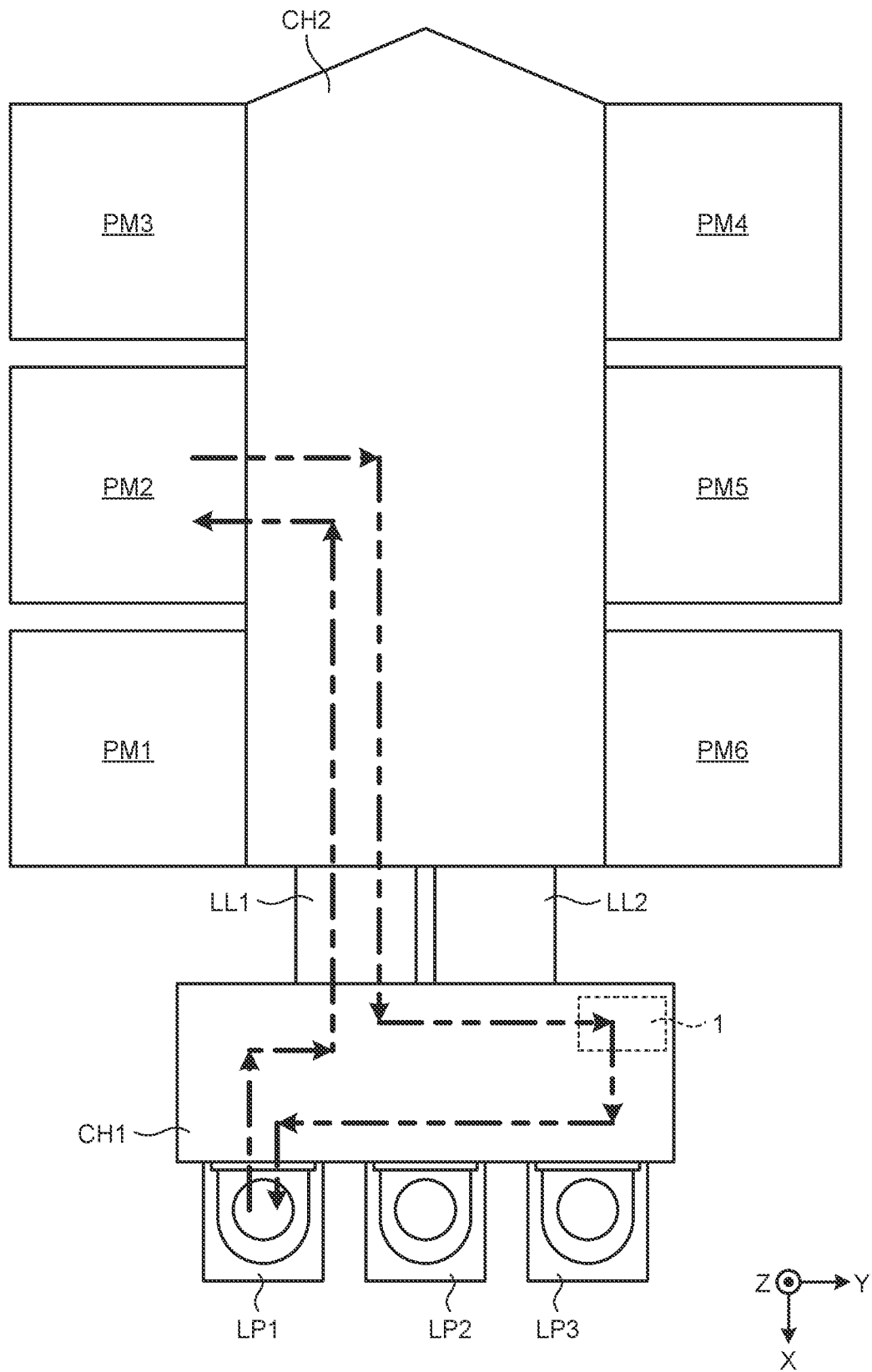
FIG. 2 is a view illustrating a schematic operation of the substrate processing system including the substrate storage apparatus according to the first embodiment.

FIG. 2 is a view illustrating a schematic operation of the substrate processing system WS. In the substrate processing system WS, as indicated by dot-dashed-line arrows in FIG. 2, the conveyance robot RB1 conveys one substrate W from the FOUP FP through the conveyance chamber CH1 to the load lock module LL1.

The load lock module LL1 is preliminarily depressurized in a state in which the substrates W are mounted in the chamber CH3. The conveyance robot RB2 conveys one substrate W from the load lock module LL1 through the conveyance chamber CH2 to, for example, the process module PM2.

When the processing for the substrate W is completed in the process module PM2, then as indicated by chain double-dashed-line arrows in FIG. 2, the conveyance robot RB2 conveys one substrate W from the process module PM2 through the conveyance chamber CH2 to the load lock module LL1.

The load lock module LL1 is opened to the atmosphere in the state in which the substrates W are mounted in the chamber CH3. The conveyance robot RB1 conveys one substrate W from the load lock module LL1 through the conveyance chamber CH1 to the substrate storage apparatus 1.

The substrate storage apparatus 1 stores the substrates W thus conveyed. The substrate storage apparatus 1 may store the conveyed substrates W in accordance with a first sequence or a second sequence. In the first sequence, the substrate storage apparatus 1 stores each of the substrates W for a predetermined time (for example, three minutes). After the elapse of the predetermined time, the substrate W is unloaded. In the second sequence, the substrate storage apparatus 1 sequentially stores the conveyed substrates W until the number of substrates W reaches the number (n pieces) for one lot. The n pieces of substrates W are unloaded collectively.

When there comes timing of unloading the substrates W from the substrate storage apparatus 1, then as indicated by chain double-dashed-line arrows in FIG. 2, the conveyance robot RB1 conveys one substrate W or the n pieces of substrates W from the substrate storage apparatus 1 through the conveyance chamber CH1 to the FOUP FP.

Figure 3:
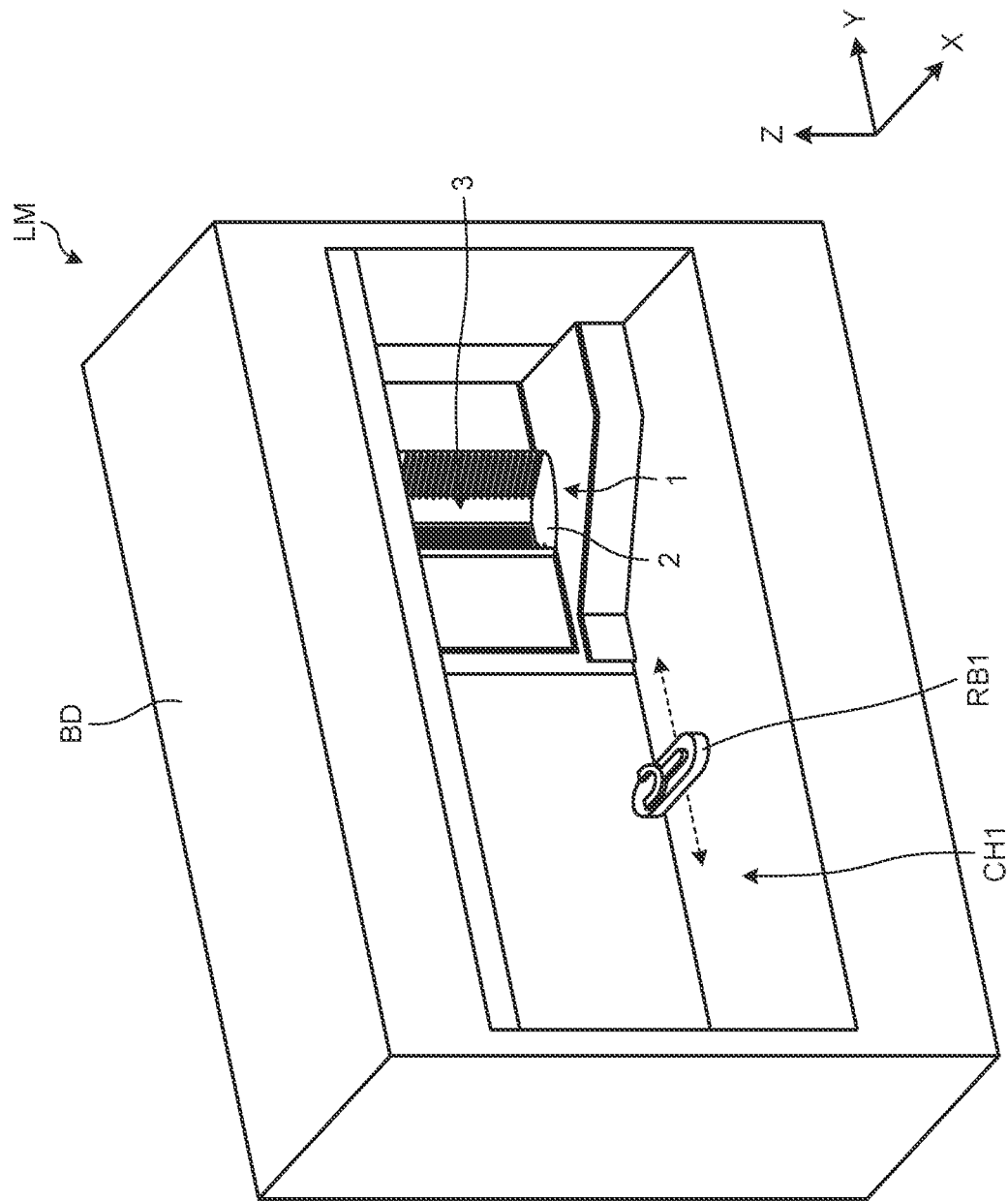
FIG. 3 is a perspective view illustrating arrangement of the substrate storage apparatus according to the first embodiment.

In the substrate processing system WS, as illustrated in FIG. 3, a cabinet 2 of the substrate storage apparatus 1 may be coupled to the body portion BD of the loader module LM in a state in which a storage space 3 in which the substrates W are to be stored is caused to communicate with the conveyance chamber CH1. FIG. 3 is a view illustrating arrangement of the substrate storage apparatus 1 in the substrate processing system WS. In FIG. 3, illustration of the rail RL1 is omitted for simplification. However, as indicated by dotted-line arrows, the conveyance robot RB1 is capable of loading and unloading the substrates W to and from the substrate storage apparatus 1 by moving in the Y-direction in the conveyance chamber CH1.

Figure 4:
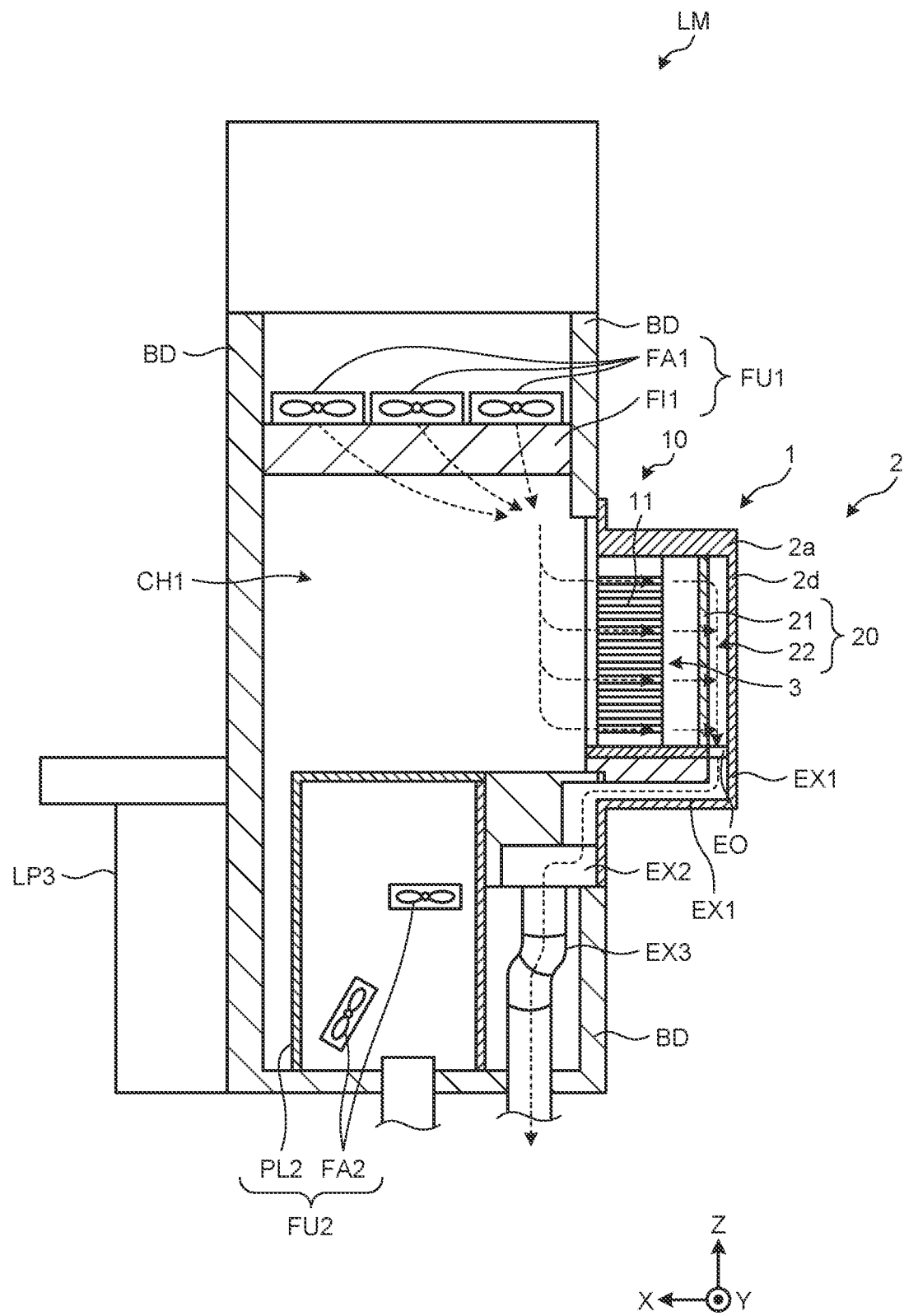
FIG. 4 is a cross-sectional view illustrating an airflow to the substrate storage apparatus according to the first embodiment.

In the loader module LM, as indicated by dotted-line arrows in FIG. 4, a flow (downflow) of gas, which roughly goes from a +Z-side toward a −Z-side, is formed. FIG. 4 is a cross-sectional view illustrating an airflow to the substrate storage apparatus 1, and illustrates an XZ-cross section when FIG. 1 is cut along a line A-A. In FIG. 4, illustration of the FOUP FP and the substrates W is omitted for simplification.

The loader module LM further includes fan units FU1 and FU2, an exhaust duct EX1, an exhaust box EX2, and an exhaust duct EX3. The fan unit FU1 is disposed on a +Z-side of the conveyance chamber CH1. The fan unit FU1 includes fans FA1 and a filter FI1. The filter FI1 is disposed between the fans FA1 and the conveyance chamber CH1 in the Z-direction. The fans FA1 blow gas in a −Z-direction. Thus, as indicated by the dotted-line arrows, there is formed such an airflow that goes from the +Z-side of the conveyance chamber CH1 toward the storage space 3 in the substrate storage apparatus 1. The airflow that has passed through the substrate storage apparatus 1 can be exhausted from an exhaust port EO to the outside via the exhaust duct EX1, the exhaust box EX2 and the exhaust duct EX3.

Note that a fan (not illustrated) may be further provided downstream of the exhaust duct EX3, and the fan may suck the gas in the exhaust duct EX3. Thus, promoted can be a flow where the airflow that has passed through the substrate storage apparatus 1 is exhausted to the outside via the exhaust port EO, the exhaust duct EX1, the exhaust box EX2 and the exhaust duct EX3.

The fan unit FU2 is disposed on a −Z-side of the conveyance chamber CH1. The fan unit FU2 includes fans FA2 and a baffle plate PL2. A plurality of through holes are formed in the baffle plate PL2. Although not illustrated, in the conveyance chamber CH1, an airflow that goes from the fan unit FU1 toward the fan unit FU2 is also formed.

The substrate storage apparatus 1 is connected to the body portion BD. The substrate storage apparatus 1 is configured to store the plurality of substrates W in multiple stages in the Z-direction. In order to clean the plurality of substrates W, the substrate storage apparatus 1 is configured to form flows of gas, which go along the plurality of substrates W, to remove a deposition on the substrates W, and to discharge the same with the gas. That is, the substrate storage apparatus 1 has a purge function.

The deposition on the substrates W, which is desired to be removed, includes a substance that, in the case of being left, can possibly cause such a defect that unnecessary films (for example, oxide films) are formed on the substrates W. The deposition on the substrates W is a fluorine component, for example. The deposition on the substrates W is discharged as it is together with the gas. The deposition on the substrates W may be discharged as a combination with moisture in the gas together with the gas. The deposition on the substrates W may be discharged as a reaction product with the moisture in the gas together with the gas.

Figure 5:
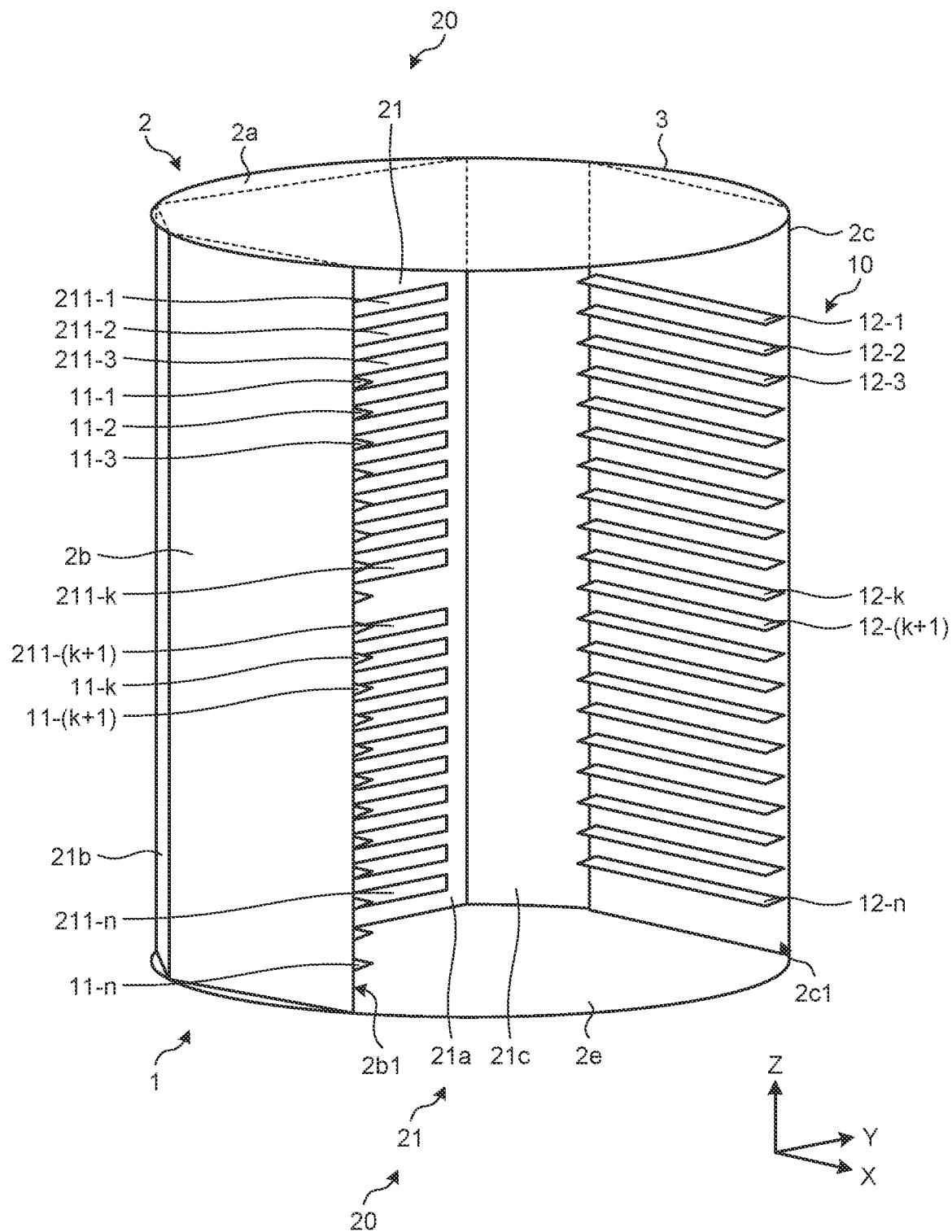
FIG. 5 is a perspective view illustrating a configuration of the substrate storage apparatus according to the first embodiment.
Figure 6:
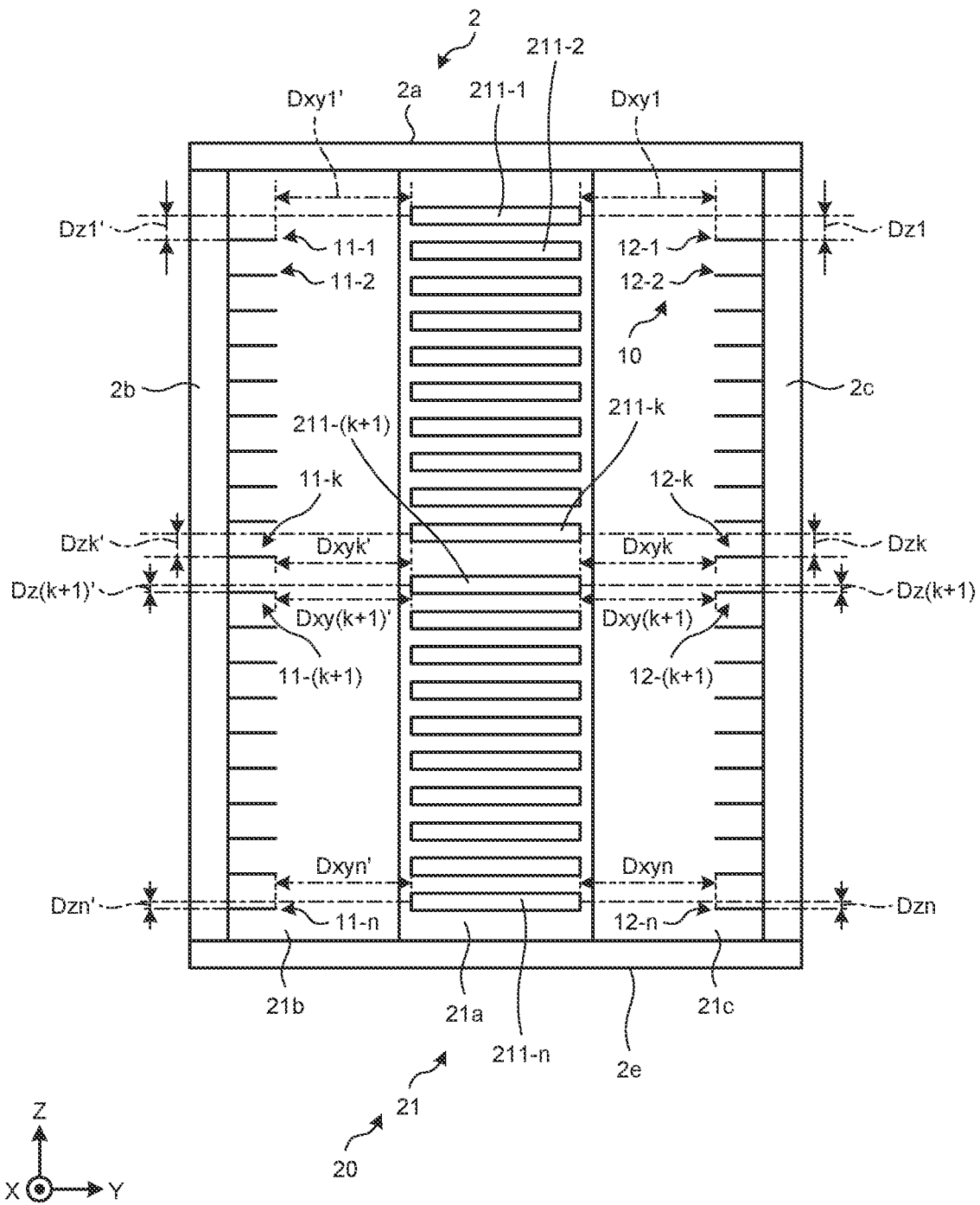
FIG. 6 is a front view illustrating the configuration of the substrate storage apparatus according to the first embodiment.

As illustrated in FIGS. 4 to 6, the substrate storage apparatus 1 includes the cabinet 2, a storage unit 10 and an exhaust unit 20. In FIG. 4, the configuration of the substrate storage apparatus 1 is illustrated by an XZ-cross-sectional view. FIG. 5 is a perspective view illustrating the configuration of the substrate storage apparatus 1. FIG. 6 is a front view illustrating the configuration of the substrate storage apparatus 1 when viewed from the +X-side. The storage space 3 is formed by being surrounded by the cabinet 2. In the storage space 3, the cabinet 2 has a wide opening on a +X-side, and is caused to communicate with the conveyance chamber CH1 through the wide opening. The storage unit 10 is disposed in the storage space 3. The exhaust unit 20 is disposed between the storage space 3 and the exhaust duct EX1.

The cabinet 2 has an upper wall $2a$, a side wall $2b$, a side wall $2c$, a side wall $2d$ and a bottom wall $2e$. The upper wall $2a$ extends in an XY-direction, and defines a +Z-side boundary of the storage space 3. The side wall $2b$ is a side wall on a −Y-side in the cabinet 2, extends in the XZ-direction, and defines a −Y-side-boundary of the storage space 3. The side wall $2c$ is a side wall on a +Y-side in the cabinet 2, extends in the XZ-direction, and defines a +Y-side-boundary of the storage space 3. The side wall $2d$ is a side wall on a −X-side in the cabinet 2, and extends in a YZ-direction. It is noted that a size of the opened +X-side portion of the storage space may correspond to a size of the side wall $2d$. The bottom wall $2e$ extends in the XY-direction, and defines a −Z-side boundary of the storage space 3.

Each of the upper wall $2a$ and the bottom wall $2e$ has an X-direction width and a Y-direction width, which correspond to the substrates W to be stored. The upper wall $2a$ and the bottom wall $2e$ may have an XY-plane shape that allows mutual correspondence therebetween. Each of the side wall $2b$ and the side wall $2c$ has an X-direction width corresponding to the substrates W to be stored. The side wall $2d$ has a Y-direction width corresponding to the substrates W to be stored. Each of the side wall $2b$, the side wall $2c$ and the side wall $2d$ has a Z-direction width corresponding to the number (for example, n pieces) of substrates W to be stored.

The storage unit 10 includes a plurality of plates 11-1 to 11-$n$ and 12-1 to 12-$n$. The respective plates 11-1 to 11-$n$ and 12-1 to 12-$n$ protrude inward from the cabinet 2. The plates 11, 12 are capable of mounting the substrates W thereon. The plurality of plates 11-1 to 11-$n$ and the plurality of plates 12-1 to 12-$n$ correspond to each other.

The plurality of plates 11-1 to 11-$n$ are arranged on a +Y-side inner surface $2b1$ of the side wall $2b$. The plurality of plates 11-1 to 11-$n$ are arrayed in the Z-direction. The respective plates 11-1 to 11-$n$ extend in the X-direction on the inner surface $2b1$ and protrude to the +Y-side.

The plurality of plates 12-1 to 12-$n$ are arranged on a −Y-side inner surface $2c1$ of the side wall $2c$. The plurality of plates 12-1 to 12-$n$ are arrayed in the Z-direction. The respective plates 12-1 to 12-$n$ extend in the X-direction on the inner surface $2c1$ and protrude to the −Y-side.

A Z-position of the plate 11-1 and a Z-position of the plate 12-1 are substantially the same. A Y-direction distance between a +Y-side end of the plate 11-1 and a −Y-side end of the plate 12-1 is smaller than a Y-direction width of each of the substrates W. Thus, the plate 11-1 and the plate 12-1 are capable of supporting the substrate W, which is to be mounted thereon, in cooperation with each other.

A Z-position of the plate 11-$k$ and a Z-position of the plate 12-$k$ are substantially the same. A Y-direction distance between a +Y-side end of the plate 11-$k$ and a −Y-side end of the plate 12-$k$ is smaller than a Y-direction width of the substrate W. Thus, the plate 11-$k$ and the plate 12-$k$ are capable of supporting the substrate W, which is to be mounted thereon, in cooperation with each other. k is an integer of more than 1 and less than n. k may be an intermediate value between 1 and n.

A Z-position of the plate 11-($k$+1) and a Z-position of the plate 12-($k$+1) are substantially the same. A Y-direction distance between a +Y-side end of the plate 11-($k$+1) and a −Y-side end of the plate 12-($k$+1) is smaller than the Y-direction width of the substrate W. Thus, the plate 11-($k$+1) and the plate 12-($k$+1) are capable of supporting the substrate W, which is to be mounted thereon, in cooperation with each other.

A Z-position of the plate 11-$n$ and a Z-position of the plate 12-$n$ are substantially the same. A Y-direction distance between a +Y-side end of the plate 11-$n$ and a −Y-side end of the plate 12-$n$ is smaller than the Y-direction width of the substrate W. Thus, the plate 11-$n$ and the plate 12-$n$ are capable of supporting the substrate W, which is to be mounted thereon, in cooperation with each other.

Note that, in the +Y-side end of each of the plates 11, a +X-side end and −X-side end thereof may be curved and extend so as to protrude toward the +Y-side in accordance with an XY-plane shape of the substrate W. In the −Y-side end of each of the plates 12, a +X-side end and −X-side end thereof may be curved and extend so as to protrude toward the −Y-side in accordance with the XY-plane shape of the substrate W. Thus, a contact area of the substrate W with the respective plates 11 and 12 when the substrate W is mounted thereon can be ensured with ease, thus making it possible to stably support the substrate W to be mounted.

The exhaust unit 20 has a wall portion 21 and an exhaust passage 22. The wall portion 21 intervenes between the storage unit 10 and the exhaust passage 22, and defines a −X-side boundary of the storage space 3. The exhaust passage 22 is a space formed by being surrounded by the side walls 12b to 12d and the wall portion 21. The exhaust passage 22 is caused to communicate with the exhaust port EO at a −Z-side end thereof. The exhaust passage 22 is caused to communicate with the exhaust duct EX1 via the exhaust port EO. It is noted that a side opposite to the wall portion 21 of the cabinet 2 in the storage unit 10 is opened.

The wall portion 21 is disposed between the storage space 3 and the side wall 2d in the X-direction, and extends along the side wall 2d. The wall portion 21 includes wall portions 21a to 21c. The wall portion 21a extends in the YZ-direction. The wall portion 21a has a +Z-side end connected to the upper wall 2a, has a −Y-side end connected to the wall portion 21b, has a +Y-side end connected to the wall portion 21c, and a −Z-side end connected to the bottom wall 2e. The wall portion 21b and the wall portion 21c extend in directions parallel to the Z-direction and inclined in the X-direction and the Y-direction. The wall portion 21b has a +Z-side end connected to the upper wall 2a, has a −Y-side end connected to the side wall 2b, has a +Y-side end connected to the wall portion 21a, and a −Z-side end connected to the bottom wall 2e. The wall portion 21c has a +Z-side end connected to the upper wall 2a, has a −Y-side end connected to the wall portion 21a, has a +Y-side end connected to the side wall 2c, and a −Z-side end connected to the bottom wall 2e.

The wall portion 21 includes a plurality of slit holes 211-1 to 211-n in the wall portion 21a. The plurality of slit holes 211-1 to 211-n correspond to the plurality of plates 11-1 to 11-n, and correspond to the plurality of plates 12-1 to 12-n.

The plurality of slit holes 211-1 to 211-n are arranged in the wall portion 21a. The plurality of slit holes 211-1 to 211-n are arranged in the Z-direction. Each of the slit holes 211-1 to 211-n extends in the Y-direction in the wall portion 21a, and penetrates the wall portion 21a from the +X-side to the −X-side.

The plurality of slit holes 211-1 to 211-n are farther from the exhaust port EO in this order. Each of the slit holes 211-(k+1) to 211-n is closer to the exhaust port EO than each of the slit holes 211-1 to 211-k.

The plurality of slit holes 211-1 to 211-n include slit holes 211 different in Z-direction distance to the plates 11 and 12 corresponding thereto. Such Z-direction distances between the slit holes 211-(k+1) to 211-n and the plates 11 and 12 corresponding thereto are smaller than such Z-direction distances between the slit holes 211-1 to 211-k and the plates 11 and 12 corresponding thereto.

For example, positions of the respective members will be expressed by gravity positions thereof. As illustrated in FIG. 6, the Z-direction distance Dz1' between the slit hole 211-1 and the plate 11-1, . . . and the Z-direction distance Dzk' between the slit hole 211-k and the plate 11-k are substantially equal to one another. The Z-direction distance Dz(k+1)' between the slit hole 211-(k+1) and the plate 11-(k+1), . . . and the Z-direction distance Dzn' between the slit hole 211-n and the plate 11-n are substantially equal to one another.

Each of the Z-direction distances Dz(k+1)' to Dzn' is smaller than each of the Z-direction distances Dz1' to Dzk'. An XY-direction distance Dxy1' between the slit hole 211-1 and the plate 11-1, . . . an XY-direction distance Dxyk' between the slit hole 211-k and the plate 11-k, an XY-direction distance Dxy(k+1)' between the slit hole 211-(k+1) and the plate 11-(k+1), . . . and an XY-direction distance Dxyn' between the slit hole 211-n and the plate 11-n are substantially equal to one another. Thus, the distances between the slit holes 211-(k+1) to 211-n and the plates 11 corresponding thereto are smaller than the distances between the slit holes 211-1 to 211-k and the plates 11 corresponding thereto.

Likewise, a Z-direction distance Dz1 between the slit hole 211-1 and the plate 12-1, . . . and a Z-direction distance Dzk between the slit hole 211-k and the plate 12-k are substantially equal to one another. A Z-direction distance Dz(k+1) between the slit hole 211-(k+1) and the plate 12-(k+1), . . . and a Z-direction distance Dzn' between the slit hole 211-n and the plate 12-n are substantially equal to one another.

Each of the Z-direction distances Dz(k+1) to Dzn is smaller than each of the Z-direction distances Dz1 to Dzk. An XY-direction distance Dxy1 between the slit hole 211-1 and the plate 12-1, . . . an XY-direction distance Dxyk between the slit hole 211-k and the plate 12-k, an XY-direction distance Dxy(k+1) between the slit hole 211-(k+1) and the plate 12-(k+1), . . . and an XY-direction distance Dxyn between the slit hole 211-n and the plate 12-n are substantially equal to one another. Thus, the distances between the slit holes 211-(k+1) to 211-n and the plates 12 corresponding thereto are smaller than the distances between the slit holes 211-1 to 211-k and the plates 12 corresponding thereto.

Figure 7:
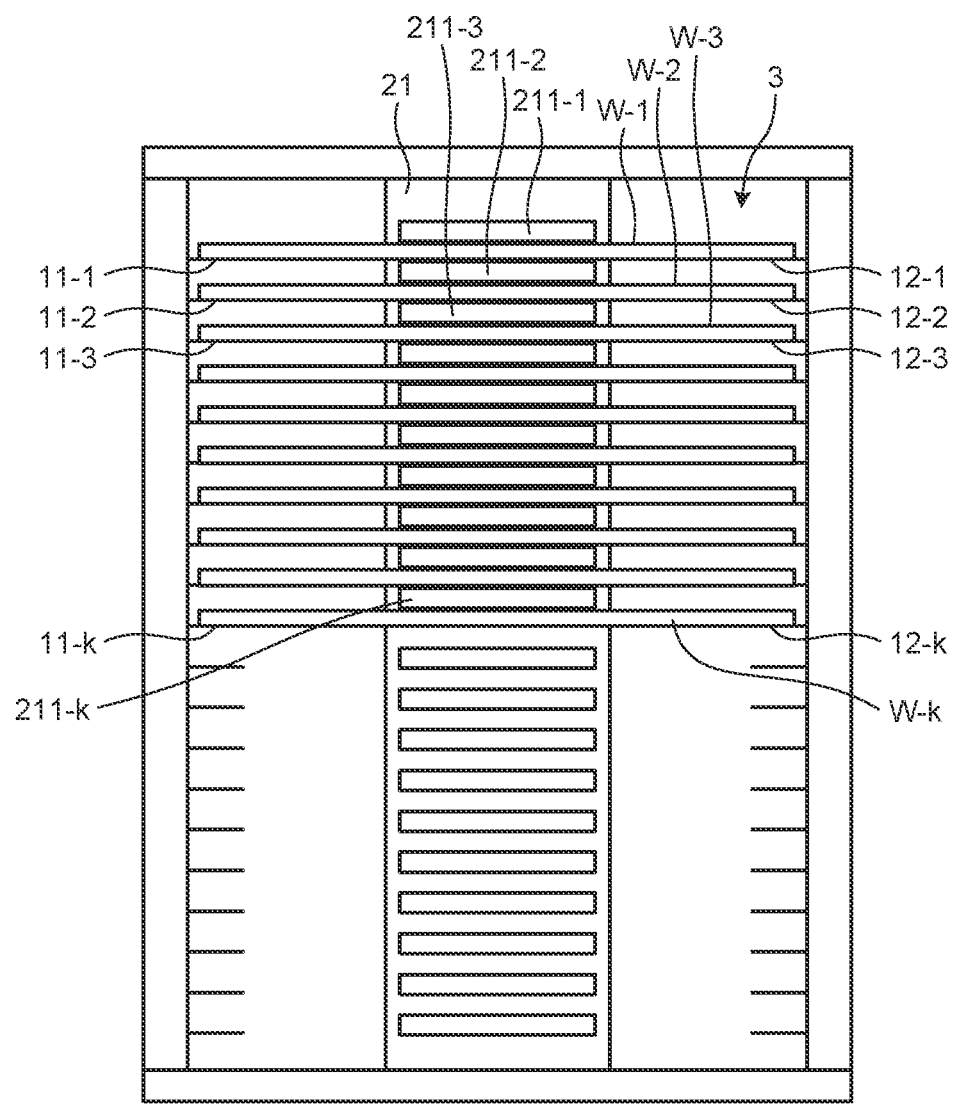
FIG. 7 is a front view illustrating an operation of the substrate storage apparatus according to the first embodiment.
Figure 8:
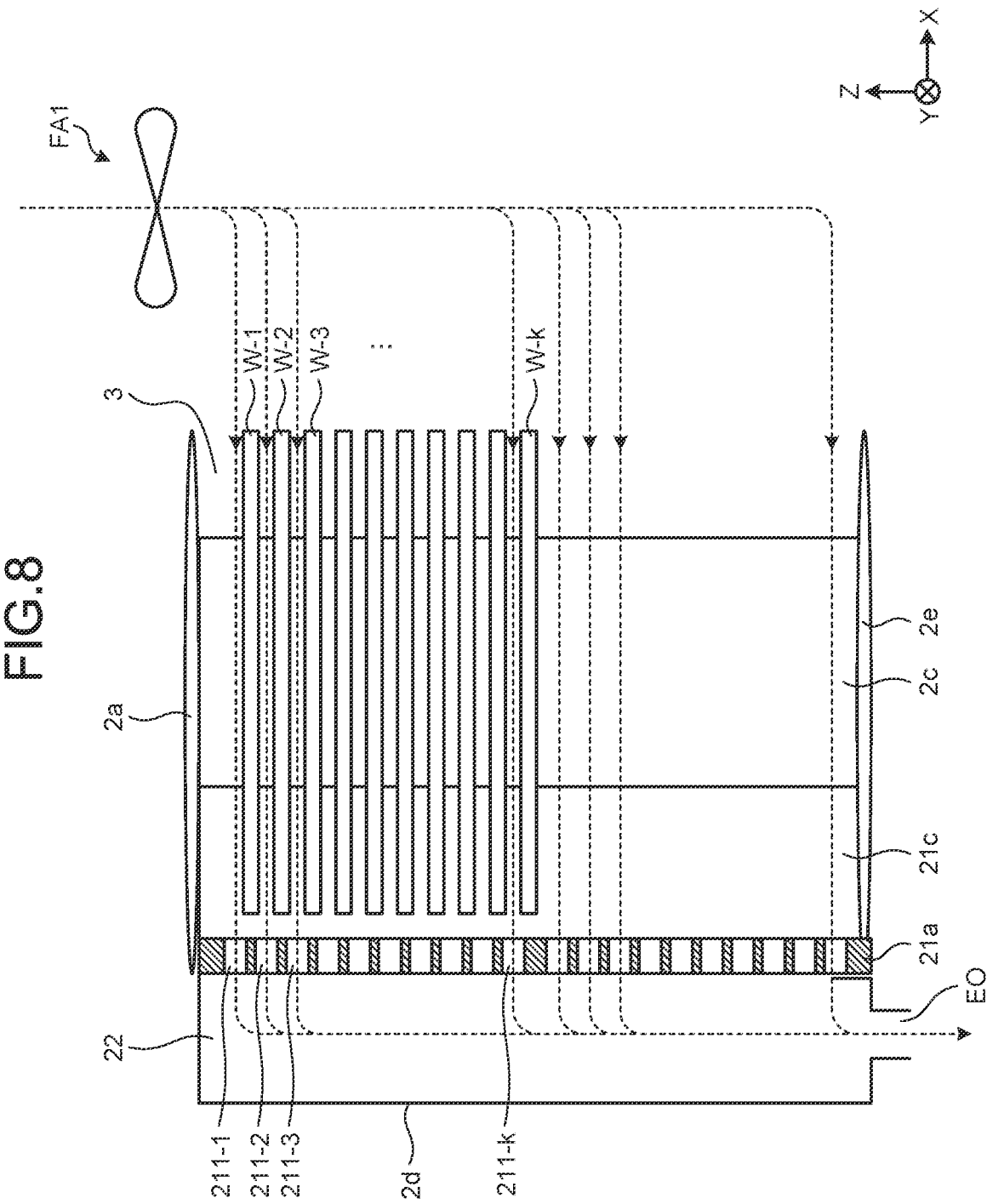
FIG. 8 is a cross-sectional view illustrating the operation of the substrate storage apparatus according to the first embodiment.
Figure 9:
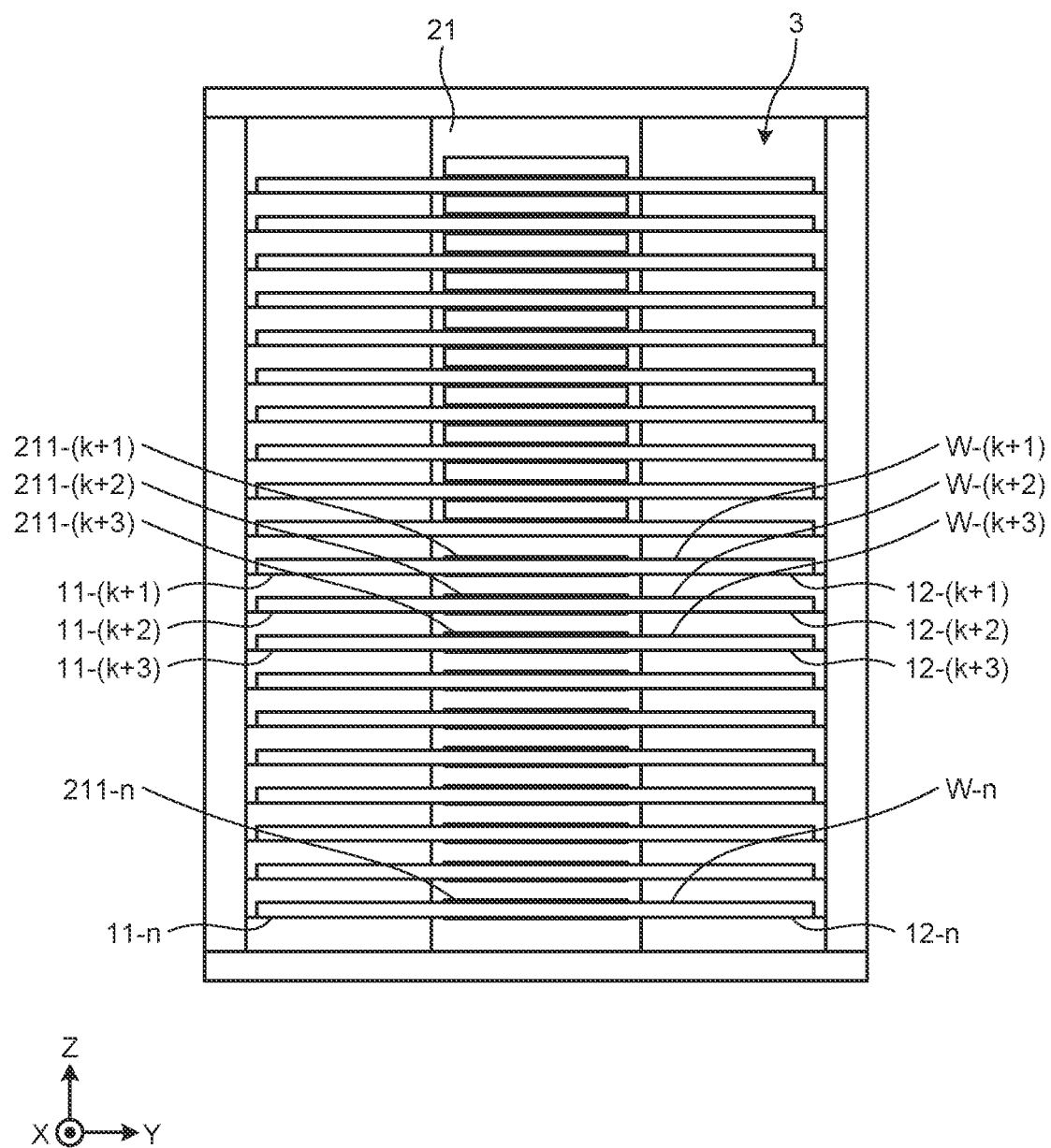
FIG. 9 is a front view illustrating the operation of the substrate storage apparatus according to the first embodiment.
Figure 10:
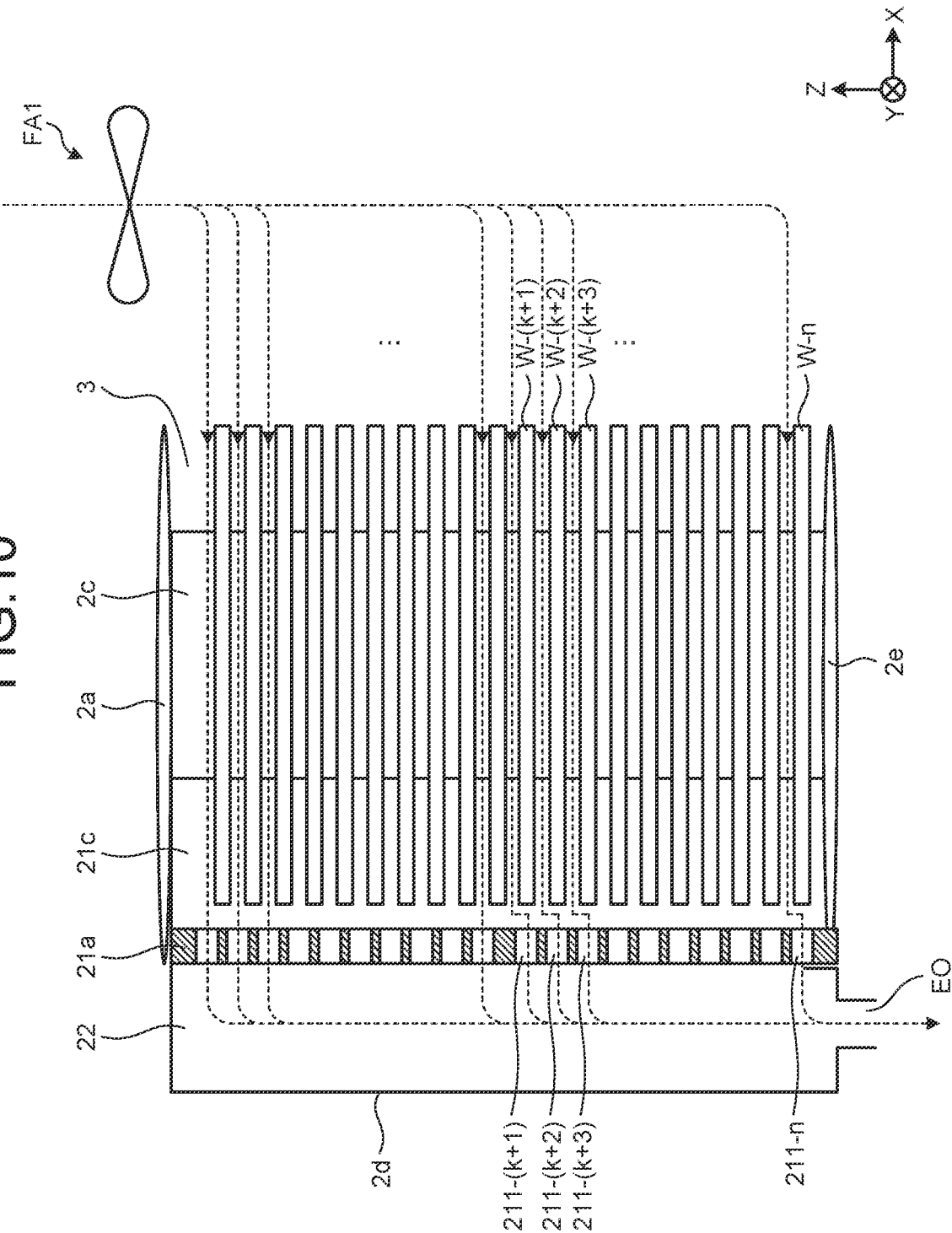
FIG. 10 is a cross-sectional view illustrating the operation of the substrate storage apparatus according to the first embodiment.

Next, a description will be given of an operation of the substrate storage apparatus 1 with reference to FIGS. 7 to 10. Each of FIGS. 7 and 9 is a front view illustrating the operation of the substrate storage apparatus 1. Each of FIGS. 8 and 10 is a cross-sectional view illustrating the operation of the substrate storage apparatus 1, and illustrates an XZ cross-section when the substrate storage apparatus 1 is cut in the XZ direction at a Y-position that passes through the slit holes 211. In FIGS. 8 and 10, illustration of the plates 11 and 12 is omitted for simplification. In FIGS. 8 and 10, the side wall 2c (see FIG. 5) is illustrated between the upper wall 2a and the bottom wall 2e in the Z-direction. In FIGS. 8 and 10, the wall portion 21c is illustrated between the wall portion 21a and the side wall 2c in the X-direction. In FIGS. 8 and 10, it is illustrated that a +X-side region of the wall portion 21c in the storage space 3 surrounded by the upper wall 2a and the bottom wall 2e is an opened region without the side wall 2c.

In FIGS. 7 to 10, the operation of the substrate storage apparatus 1, which is in accordance with the second sequence, is illustrated. In the second sequence, the substrate storage apparatus 1 sequentially stores the conveyed substrates W-1 to W-n until the number of substrates W reaches the number (n pieces) for one lot. Then, the n pieces of substrates W-1 to W-n are unloaded collectively.

For example, it is assumed that there is formed a flow (downflow) of gas, which, by the fans FA1, goes from a +Z-side region of the conveyance chamber CH1 toward a −Z-side thereof and blows into the storage space 3.

The conveyance robot RB1 loads the substrate W-1, which is illustrated in FIG. 7, from the load lock module LL1 via the conveyance chamber CH1 into the storage space 3, and mounts the substrate W-1 on the surfaces (+Z-side surfaces) of the plate 11-1 and the plate 12-1. At this time, when viewed from the +X-side, the substrate W-1 is disposed at a Z-position where an overlap thereof with the slit hole 211-1 is relatively small.

The conveyance robot RB1 loads the substrate W-2, which is illustrated in FIG. 7, from the load lock module LL1 via the conveyance chamber CH1 into the storage space 3, and mounts the substrate W-2 on the surfaces of the plate 11-2 and the plate 12-2. At this time, when viewed from the +X-side, the substrate W-2 is disposed at a Z-position where an overlap thereof with the slit hole 211-2 is relatively small.

The conveyance robot RB1 loads the substrate W-k, which is illustrated in FIG. 7, from the load lock module LL1 via the conveyance chamber CH1 into the storage space 3, and mounts the substrate W-k on the surfaces of the plate 11-$k$ and the plate 12-$k$. At this time, when viewed from the +X-side, the substrate W-k is disposed at a Z-position where an overlap thereof with the slit hole 211-$k$ is relatively small.

Herein, as illustrated in FIG. 7, the respective slit holes 211-1 to 211-$k$ have a slit shape that extends in the Y-direction along the surfaces of the substrates W-1 to W-k. Thus, there can be formed an airflow with a distribution shape (a shape in a region where the airflow is strong) that goes along the surfaces of the substrates W-1 to W-k when viewed in a YZ-cross section. As a result, the deposition can be efficiently removed from the surfaces of the substrates W-1 to W-k, and the surfaces of the substrates W-1 to W-k can be cleaned with ease.

Further, as illustrated in FIG. 8, the vicinities of the centers of the slit holes 211-1 to 211-$k$ will be present on extension lines of flow paths of gas that passes through the vicinities of the surfaces of the substrates W-1 to W-k. Herein, the gas is a part of gas that has blown into the storage space 3. Thus, the gas that passes through the vicinities of the surfaces of the substrates W-1 to W-k can smoothly pass through the slit holes 211-1 to 211-$k$ and can be discharged via the exhaust passage 22 to the exhaust port EO.

The conveyance robot RB1 loads the substrate W-(k+1), which is illustrated in FIG. 9, from the load lock module LL1 via the conveyance chamber CH1 into the storage space 3, and mounts the substrate W-(k+1) on the +Z-side surfaces of the plate 11-($k$+1) and the plate 12-($k$+1). At this time, when viewed from the +X-side, the substrate W-(k+1) is disposed at a Z-position where an overlap thereof with the slit hole 211-($k$+1) is relatively large.

The conveyance robot RB1 loads the substrate W-(k+2), which is illustrated in FIG. 9, from the load lock module LL1 via the conveyance chamber CH1 into the storage space 3, and mounts the substrate W-(k+2) on the +Z-side surfaces of the plate 11-($k$+2) and the plate 12-($k$+2). At this time, when viewed from the +X-side, the substrate W-(k+2) is disposed at a Z-position where an overlap thereof with the slit hole 211-($k$+2) is relatively large.

The conveyance robot RB1 loads the substrate W-n, which is illustrated in FIG. 9, from the load lock module LL1 via the conveyance chamber CH1 into the storage space 3, and mounts the substrate W-n on the +Z-side surfaces of the plate 11-$n$ and the plate 12-$n$. At this time, when viewed from the +X-side, the substrate W-n is disposed at a Z-position where an overlap thereof with the slit hole 211-$n$ is relatively large.

Then, after a predetermined time elapses, the substrates W-1 to W-n are unloaded collectively from the storage space 3. That is, the conveyance robot RB1 unloads the substrates W-1 to W-n sequentially and continuously from the storage space 3 to the load port LP.

Herein, as illustrated in FIG. 9, the respective slit holes 211-($k$+1) to 211-$n$ have a slit shape that extends in the Y-direction along the surfaces of the substrates W-(k+1) to W-n. Thus, there can be formed an airflow with a distribution shape (a shape in a region where the airflow is strong) that goes along the surfaces of the substrates W-(k+1) to W-n when viewed in the YZ-cross section. As a result, the deposition can be efficiently removed from the surfaces of the substrates W-(k+1) to W-n, and the surfaces of the substrates W-(k+1) to W-n can be cleaned with ease.

Further, as illustrated in FIG. 10, the wall portion 21 in a range of the slit holes 211-($k$+1) to 211-$n$ will be present on extension lines of flow paths of gas that passes through the vicinities of the surfaces of the substrates W-(k+1) to W-n. Herein, the gas is a part of the gas that has blown into the storage space 3. Thus, the gas that passes through the vicinities of the surfaces of the substrates W-(k+1) to W-n can be discharged to the exhaust port EO via the slit holes 211 and the exhaust passage 22 while a flow rate thereof is being attenuated since the gas hits the wall portion 21 in the range of the slit holes 211-($k$+1) to 211-$n$.

When the slit holes 211-1 to 211-$k$ and the slit holes 211-($k$+1) to 211-$n$ are compared with each other, the slit holes 211-1 to 211-$k$ are farther from the exhaust port EO than the slit holes 211-($k$+1) to 211-$n$. Accordingly, airflow conductance of the slit holes 211-1 to 211-$k$ is apt to be lower than airflow conductance of the slit holes 211-($k$+1) to 211-$n$.

For this, in the substrate storage apparatus 1, as illustrated in FIG. 6, the distances between the slit holes 211-($k$+1) to 211-$n$ and the plates 11 and 12 corresponding thereto are smaller than the distances between the slit holes 211-1 to 211-$k$ and the plates 11 and 12 corresponding thereto. Thus, while the substrates W-1 to W-k are arranged at the Z-positions where the overlaps with the slit holes 211-1 to 211-$k$ are relatively small when viewed from the +X-side (see FIG. 7), the substrates W-(k+1) to W-n are arranged at the Z-positions where the overlaps with the slit holes 211-($k$+1) to 211-$n$ are relatively large when viewed from the +X-side (see FIG. 9).

As a result, the airflow conductance of the slit holes 211-($k$+1) to 211-$n$ can be attenuated and brought closer to the airflow conductance of the slit holes 211-1 to 211-$k$. Further, when a fan (not illustrated) is provided downstream of the exhaust duct EX3, and a negative pressure is formed in the exhaust passage 22, the airflow conductance of the slit holes 211-1 to 211-$k$ can be somewhat increased by attenuating the airflow conductance of the slit holes 211-($k$+1) to 211-$n$. Thus, the airflow conductance of the slit holes 211-1 to 211-$k$ and the airflow conductance of the slit holes 211-($k$+1) to 211-$n$ can be substantially equated to each other. That is, a cleaning ability of the substrate storage apparatus 1 for the substrates W-1 to W-k and a cleaning ability thereof for the substrates W-(k+1) to W-n can be equated to each other.

As described above, in the first embodiment, in the substrate storage apparatus 1, the distances between the slit holes 211-($k$+1) to 211-$n$ and the plates 11 and 12 corresponding thereto are smaller than the distances between the slit holes 211-1 to 211-$k$ and the plates 11 and 12 corresponding thereto. Thus, the airflow conductance of the slit holes 211-1 to 211-$k$ and the airflow conductance of the slit holes 211-($k$+1) to 211-$n$ can be substantially equated to each other. As a result, the plurality of substrates W-1 to W-n stored in the substrate storage apparatus 1 can be cleaned evenly. Hence, the substrate storage apparatus 1 can stably remove an unwanted item (for example, a fluorine component) attached to the respective stored substrates W-1 to W-n, and can put the respective stored substrates W-1 to W-n in an appropriate state.

Note that, though FIGS. 3 and 4 illustrate the configuration in the case where the substrate storage apparatus 1 includes the cabinet 2 corresponding to one lot (n pieces) of the substrates W, the substrate storage apparatus 1 may include a plurality of the cabinets 2 corresponding to plural lots of the substrates W. In this case, the plurality of cabinets 2 may be stacked on one another in the Z-direction, or may be arrayed in the XY-direction.

Second Embodiment

Next, a description will be given of a substrate storage apparatus 101 according to a second embodiment. A description will be mainly given below of different portions from those in the first embodiment.

In the first embodiment, it is illustrated that the arrangement positions of the openings (slit holes 211) of the wall portion 21 are devised, and in the second embodiment, it is illustrated that the arrangement positions of the plates 11 and 12 of the storage unit 110 are devised.

Figure 11:
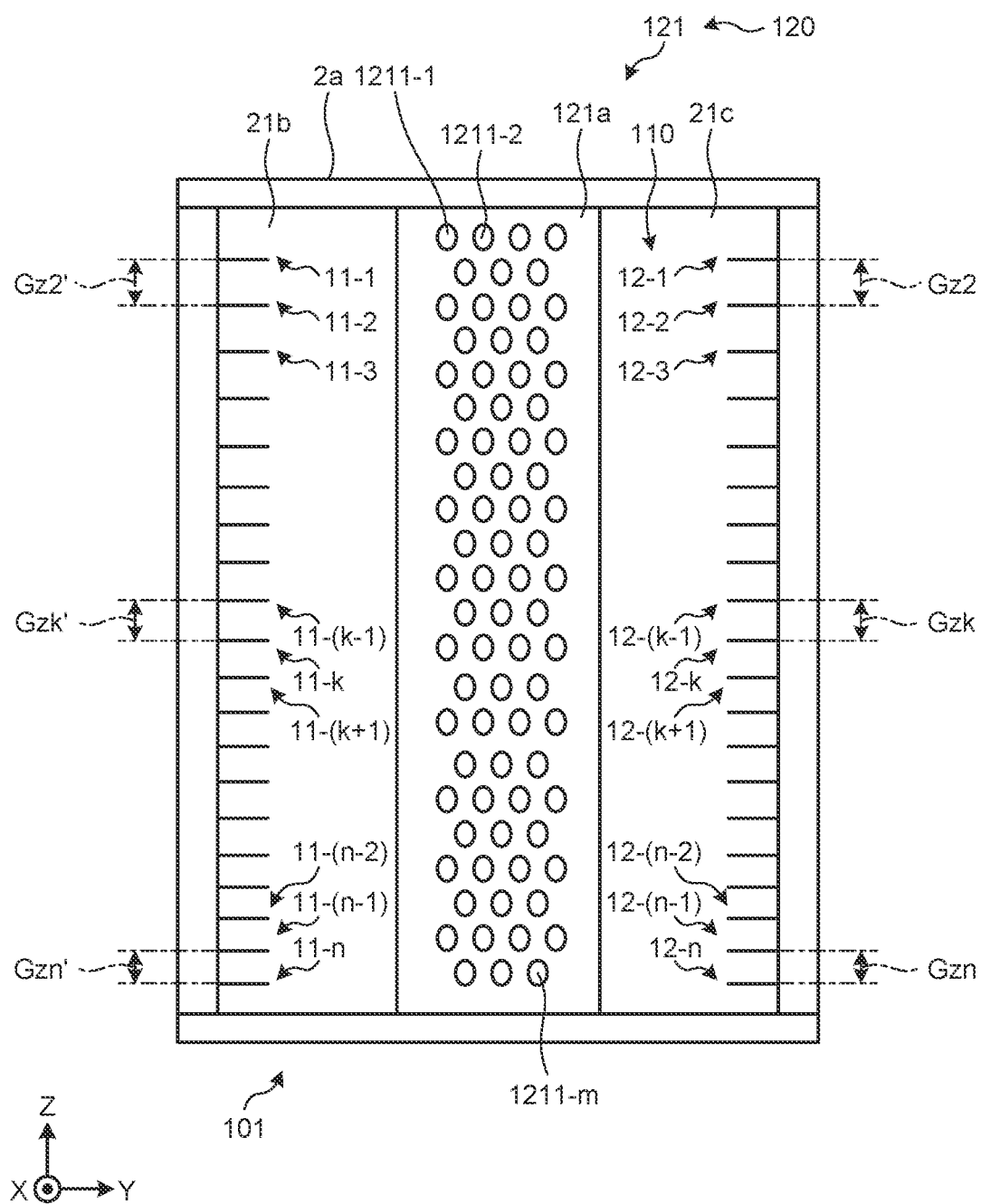
FIG. 11 is a front view illustrating a configuration of a substrate storage apparatus according to a second embodiment.

Specifically, the substrate storage apparatus 101 includes a storage unit 110 and an exhaust unit 120, which are illustrated in FIG. 11, in place of the storage unit 10 and the exhaust unit 20 (see FIG. 6). FIG. 11 is a YZ-front view illustrating the configuration of the substrate storage apparatus 101.

The exhaust unit 120 has a wall portion 121 in place of the wall portion 21 (see FIG. 6). The wall portion 121 has a wall portion 121a in place of the wall portion 21a.

The wall portion 121a includes a plurality of holes 1211-1 to 1211-m in place of the plurality of slit holes 211-1 to 211-n. m is an arbitrary integer of two or more.

The plurality of holes 1211-1 to 1211-m are arranged in the wall portion 121a. The plurality of holes 1211-1 to 1211-m are two-dimensionally arrayed in the YZ-direction in the wall portion 121a. With regard to the plurality of holes 1211-1 to 1211-m, an arrangement density thereof in the Z-direction in the wall portion 121a may be uniform. FIG. 11 illustrates a configuration in which the plurality of holes 1211-1 to 1211-m are arrayed in a checker pattern; however, the array of the plurality of holes 1211-1 to 1211-m may be an array in another form as long as the arrangement density thereof in the Z-direction is uniform. For example, the plurality of holes 1211-1 to 1211-m may be arrayed in a lattice pattern.

Each of the holes 1211-1 to 1211-m penetrates the wall portion 121a from the +X-side to the −X-side. Each of the holes 1211-1 to 1211-m has a substantially circular shape or a substantially elliptical shape when viewed in a YZ-plane. The plurality of holes 1211-1 to 1211-m are arranged so as to be aligned with the plurality of plates 11 and 12 in an XY-plane direction that intersects the Z-direction.

In the storage unit 110, the plurality of plates 11 have Z-direction intervals increased gradually or in stages from the −Z-side toward the +Z-side. At this time, the arrangement density of the holes 1211 in the Z-direction in the wall portion 121a is roughly even. Accordingly, total opening areas of the holes 1211 individually corresponding to regions each of which is located between two plates 11 adjacent to each other in the Z-direction can be increased gradually or in stages from the −Z-side toward the +Z-side.

The total opening area of the holes 1211 corresponding to the region between two plates 11 may be defined as a total of areas of holes 1211 arranged in a region between a Z-position of a front surface of the plate 11 and a Z-position of a back surface of the plate 11 adjacent thereto on the +Z-side when viewed from the +X-side. The total opening area may include an area of a portion that partially overlaps an extension line of the plate 11 in the Y-direction.

A Z-direction interval Gzk' between the plate 11-(k−1) and the plate 11-k is wider than a Z-direction interval Gzn' between the plate 11-(n−1) and the plate 11-n. A total opening area of the holes 1211 corresponding to the Z-direction interval Gzk' is larger than a total opening area of the holes 1211 corresponding to the Z-direction interval Gzn'.

A Z-direction interval Gz2' between the plate 11-1 and the plate 11-2 is wider than the Z-direction interval Gzk'. A total opening area of the holes 1211 corresponding to the Z-direction interval Gz2' is larger than a total opening area of the holes 1211 corresponding to the Z-direction interval Gzk'.

The plurality of plates 12 have Z-direction intervals increased gradually or in stages from the −Z-side toward the +Z-side. At this time, the arrangement density of the holes 1211 in the Z-direction in the wall portion 121a is roughly even. Accordingly, total opening areas of the holes 1211 individually corresponding to regions each of which is located between two plates 12 adjacent to each other in the Z-direction can be increased gradually or in stages from the −Z-side toward the +Z-side.

The total opening area of the holes 1211 corresponding to the region between two plates 12 may be defined as a total of areas of holes 1211 arranged in a region between a Z-position of a front surface of the plate 12 and a Z-position of a back surface of the plate 12 adjacent thereto on the +Z-side when viewed from the +X-side. The total opening area may include an area of a portion that partially overlaps an extension line of the plate 12 in the Y-direction.

A Z-direction interval Gzk between the plate 12-(k−1) and the plate 12-k is wider than a Z-direction interval Gzn between the plate 12-(n−1) and the plate 12-n. A total opening area of the holes 1211 corresponding to the Z-direction interval Gzk is larger than a total opening area of the holes 1211 corresponding to the Z-direction interval Gzn.

A Z-direction interval Gz2 between the plate 12-1 and the plate 12-2 is wider than the Z-direction interval Gzk. A total opening area of the holes 1211 corresponding to the Z-direction interval Gz2 is larger than a total opening area of the holes 1211 corresponding to the Z-direction interval Gzk.

Next, a description will be given of an operation of the substrate storage apparatus 101 with reference to FIGS. 12A to 12C. Each of FIGS. 12A to 12C is a YZ-front view illustrating the operation of the substrate storage apparatus 101, and illustrates a configuration when the substrate storage apparatus 101 is viewed from the +X-side.

In FIGS. 12A to 12C, the operation of the substrate storage apparatus 101, which is in accordance with the first sequence, is illustrated. In the first sequence, the substrate storage apparatus 101 stores each of the substrates W for a predetermined time. After the elapse of the predetermined time, the substrate W is unloaded. FIGS. 12A to 12C illustrate the case where the predetermined time is three minutes and the substrate W is loaded every minute.

For example, it is assumed that there is formed a flow (downflow) of gas, which, by the fans FA1, goes from the +Z-side region of the conveyance chamber CH1 toward the −Z-side thereof and blows into the storage space 3.

The conveyance robot RB1 loads the substrate W-1 from the load lock module LL1 via the conveyance chamber CH1 into the storage space 3, and mounts the substrate W-1 on the surfaces of the plate 11-1 and the plate 12-1. The conveyance robot RB1 loads the substrate W-2 from the load lock module LL1 via the conveyance chamber CH1 into the storage space 3, and mounts the substrate W-2 on the surfaces of the plate 11-2 and the plate 12-2. The conveyance robot RB1 loads the substrate W-3 from the load lock module LL1 via the conveyance chamber CH1 into the storage space 3, and mounts the substrate W-3 on the surfaces of the plate 11-3 and the plate 12-3.

At timing immediately before the substrate W-1 is unloaded, the substrate storage apparatus 101 stores the substrates W-1 to W-3. At this time, it is assumed that, as illustrated in FIG. 12A, a total opening area of the holes 1211 corresponding to regions between the respective plates 11-1 to 11-3 and a total opening area of the holes 1211 corresponding to regions between the respective plates 12-1 to 12-3 are roughly OA1. Note that, with regard to the plates 11-1 and 12-1, no regions are present between the same and the plates 11 and 12 adjacent thereto on the +Z-side. However, an arrangement density of the holes 1211 in the Z-direction in the wall portion 121a is substantially even, and therefore, the arrangement positions of the plates 11-1 and 12-1 in the Z-direction are devised, thus making it possible to equate, between the −Z-side and the +Z-side, the total opening areas of the holes 1211 corresponding thereto.

Thereafter, the conveyance robot RB1 loads the substrate W-(k−1) from the load lock module LL1 via the conveyance chamber CH1 into the storage space 3, and mounts the substrate W-(k−1) on the surfaces of the plate 11-(k−1) and the plate 12-(k−1). The conveyance robot RB1 loads the substrate W-k from the load lock module LL1 via the conveyance chamber CH1 into the storage space 3, and mounts the substrate W-k on the surfaces of the plate 11-k and the plate 12-k. The conveyance robot RB1 loads the substrate W-(k+1) from the load lock module LL1 via the conveyance chamber CH1 into the storage space 3, and mounts the substrate W-(k+1) on the surfaces of the plate 11-(k+1) and the plate 12-(k+1).

At timing immediately before the substrate W-(k−1) is unloaded, the substrate storage apparatus 101 stores the substrates W-(k−1) to W-(k+1). At this time, it is assumed that, as illustrated in FIG. 12B, a total opening area of the holes 1211 corresponding to regions between the respective plates 11-(k−1) to 11-(k+1) and a total opening area of the holes 1211 corresponding to regions between the respective plates 12-(k−1) to 12-(k+1) are roughly OA2. The total opening area OA1 is larger than the total opening area OA2.

Thereafter, the conveyance robot RB1 loads the substrate W-(n−2) from the load lock module LL1 via the conveyance chamber CH1 into the storage space 3, and mounts the substrate W-(n−2) on the surfaces of the plate 11-(n−2) and the plate 12-(n−2). The conveyance robot RB1 loads the substrate W-(n−1) from the load lock module LL1 via the conveyance chamber CH1 into the storage space 3, and mounts the substrate W-(n−1) on the surfaces of the plate 11-(n−1) and the plate 12-(n−1). The conveyance robot RB1 loads the substrate W-n from the load lock module LL1 via the conveyance chamber CH1 into the storage space 3, and mounts the substrate W-n on the surfaces of the plate 11-n and the plate 12-n.

At timing immediately before the substrate W-(n−2) is unloaded, the substrate storage apparatus 101 stores the substrates W-(n−2) to W-n. At this time, it is assumed that, as illustrated in FIG. 12C, a total opening area of the holes 1211 corresponding to regions between the respective plates 11-(n−2) to 11-n and a total opening area of the holes 1211 corresponding to regions between the respective plates 12-(n−2) to 12-n are roughly OA3. The total opening area OA1 is larger than the total opening area OA3. The total opening area OA2 is larger than the total opening area OA3.

Herein, when the holes 1211 arranged on the +Z-sides of the plates 11-1 and 12-1 and the holes 1211 arranged on the +Z-sides of the plates 11-k and 12-k are compared with each other, the holes 1211 arranged on the +Z-sides of the plates 11-1 and 12-1 are farther from the exhaust port EO (see FIG. 4) than the holes 1211 arranged on the +Z-sides of the plates 11-k and 12-k. Therefore, airflow conductance of the holes 1211 arranged on the +Z-sides of the plates 11-1 and 12-1 is apt to be lower than airflow conductance of the holes 1211 arranged on the +Z-sides of the plates 11-k and 12-k.

For this, in the substrate storage apparatus 101, as illustrated in FIGS. 12A and 12B, the total opening area OA1 of the holes 1211 corresponding to the respective regions between the plates 11-1 to 11-3 (that is, the respective regions between the plates 12-1 to 12-3) is larger than the total opening area OA2 of the holes 1211 corresponding to the respective regions between the plates 11-(k−1) to 11-(k+1) (that is, the respective regions between the plates 12-(k−1) to 12-(k+1)). Thus, a difference between the airflow conductances can be reduced, and a flow rate of the gas that passes through the vicinity of the surface of the substrate W-1 and a flow rate of the gas that passes through the vicinity of the surface of the substrate W-k can be brought closer to each other. That is, a cleaning ability of the substrate storage apparatus 101 for the substrate W-1 and a cleaning ability thereof for the substrate W-k can be substantially equated to each other.

When the holes 1211 arranged on the +Z-sides of the plates 11-k and 12-k and the holes 1211 arranged on the +Z-sides of the plates 11-n and 12-n are compared with each other, the holes 1211 arranged on the +Z-sides of the plates 11-k and 12-k are farther from the exhaust port EO than the holes 1211 arranged on the +Z-sides of the plates 11-n and 12-n. Therefore, airflow conductance of the holes 1211 arranged on the +Z-sides of the plates 11-k and 12-k is apt to be lower than airflow conductance of the holes 1211 arranged on the +Z-sides of the plates 11-n and 12-n.

For this, in the substrate storage apparatus 101, as illustrated in FIGS. 12B and 12C, the total opening area OA2 of the holes 1211 corresponding to the respective regions between the plates 11-(k−1) to 11-(k+1) (that is, the respective regions between the plates 12-(k−1) to 12-(k+1)) is larger than the total opening area OA3 of the holes 1211 corresponding to the respective regions between the plates 11-(n−2) to 11-n (that is, the respective regions between the plates 12-(n−2) to 12-n). Thus, a difference between the airflow conductances can be reduced, and a flow rate of the gas that passes through the vicinity of the surface of the substrate W-k and a flow rate of the gas that passes through the vicinity of the surface of the substrate W-n can be brought closer to each other. That is, a cleaning ability of the substrate storage apparatus 101 for the substrate W-k and a cleaning ability thereof for the substrate W-n can be substantially equated to each other.

As described above, in the second embodiment, in the substrate storage apparatus 101, the plurality of plates 11 and 12 have Z-direction intervals increased gradually or in stages from the −Z-side toward the +Z-side. Thus, the total opening areas of the holes 1211 corresponding to the respective regions each of which is located between Z positions of two plates 11 or 12 adjacent to each other in the Z-direction can be increased gradually or in stages from the −Z-side toward the +Z-side. As a result, the difference between the airflow conductances corresponding to the distances from the exhaust port EO can be reduced among the holes 1211 corresponding to the respective regions between the plurality of plates 11 and 12 adjacent to one another in the Z-direction. Thus, the flow rates of the gas that passes through the vicinities of the surfaces of the substrates W mounted individually on the surfaces of the plurality of plates 11 and 12 in the Z-direction can be substantially equated to one another. Hence, the plurality of substrates W-1 to W-n stored in the substrate storage apparatus 101 can be cleaned evenly.

Note that FIG. 11 illustrates such a configuration in which the Z-direction intervals of the plurality of plates 11 and 12 are gradually increased from the −Z-side toward the +Z-side; however, the Z-direction intervals of the plurality of plates 11 and 12 may be increased in stages from the −Z-side toward the +Z-side.

For example, when the Z-direction intervals are increased in two stages, the Z-direction intervals of the plurality of plates 11 and 12 are substantially equal to one another among the respective plates 11-1 to 11-$k$ and among the respective plates 12-1 to 12-$k$, and are substantially equal to one another among the respective plates 11-($k$+1) to 11-$n$ and among the respective plates 12-($k$+1) to 12-$n$. The Z-direction intervals between the respective plates 11-1 to 11-$k$ and between the respective plates 12-1 to 12-$k$ are wider than the Z-direction intervals between the respective plates 11-($k$+1) to 11-$n$ and 12-($k$+1) to 12-$n$. Also in this case, the total opening area of the holes 1211 corresponding to the respective regions between two plates 11 or 12 adjacent to each other in the Z-direction can be increased in stages from the −Z-side toward the +Z-side, and the difference between the airflow conductances corresponding to the distances from the exhaust port EO can be reduced between the holes 1211 arranged in the wall portion 121$a$ in the respective regions.

Third Embodiment

Next, a description will be given of a substrate storage apparatus 201 according to a third embodiment. A description will be mainly given below of different portions from those in the first embodiment and the second embodiment.

In the first embodiment and the second embodiment, it is illustrated that the configurations of the substrate storage apparatuses 1 and 101 are devised, and in the third embodiment, it is illustrated that an operation of the substrate storage apparatus 201 is devised.

Figure 13:
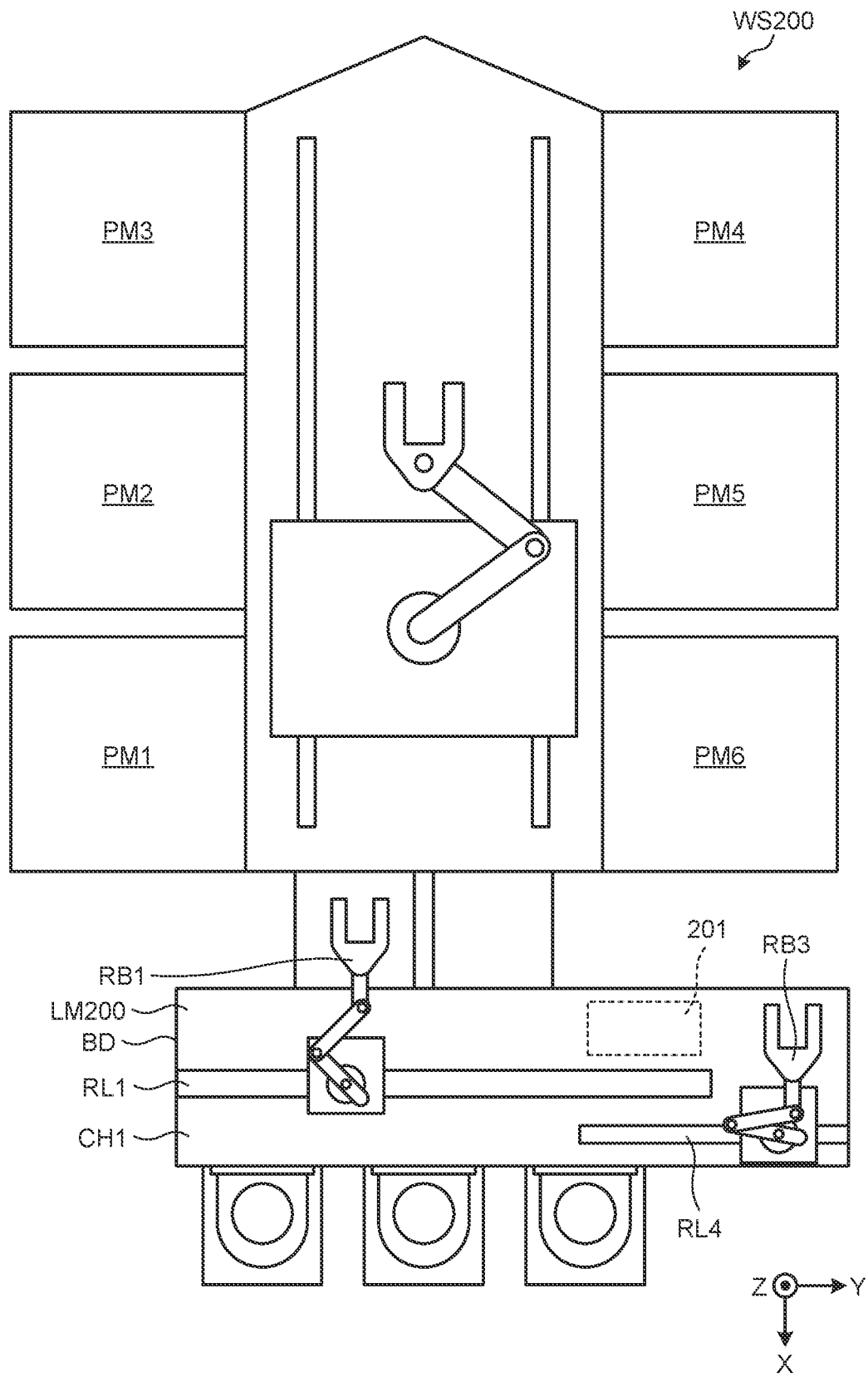
FIG. 13 is a view illustrating a schematic configuration of a substrate processing system including a substrate storage apparatus according to a third embodiment.

Specifically, as illustrated in FIG. 13, a substrate processing system WS200 includes a loader module LM200 in place of the loader module LM (see FIG. 1). FIG. 13 is a view illustrating a schematic configuration of the substrate processing system WS200 including a substrate storage apparatus 201. The loader module LM200 further includes a conveyance robot RB3 and a rail RL4. The rail RL4 is disposed at a position of not interfering with the rail RL1 in the conveyance chamber CH1. The rail RL4 extends in the Y-direction so as to include a Y-position of the substrate storage apparatus 201. The conveyance robot RB3 is configured to be movable in the Y-direction along the rail RL4.

The conveyance robot RB3 has a plurality of arms AM. The number of arms AM is smaller than the number (n pieces) corresponding to the number of pieces storable in the substrate storage apparatus 201. For example, the conveyance robot RB3 has n−1 pieces of arms AM-1 to AM-(n−1) (see FIG. 16A). The n−1 pieces of arms AM-1 to AM-(n−1) are coupled to one another so as to be spaced apart from one another in the Z-direction. Z-positions of the n−1 pieces of arms AM-1 to AM-(n−1) correspond to Z-positions of the plates 11-1 to 11-($n$−1), and correspond to Z-positions of the plates 12-1 to 12-($n$−1).

Figure 14:
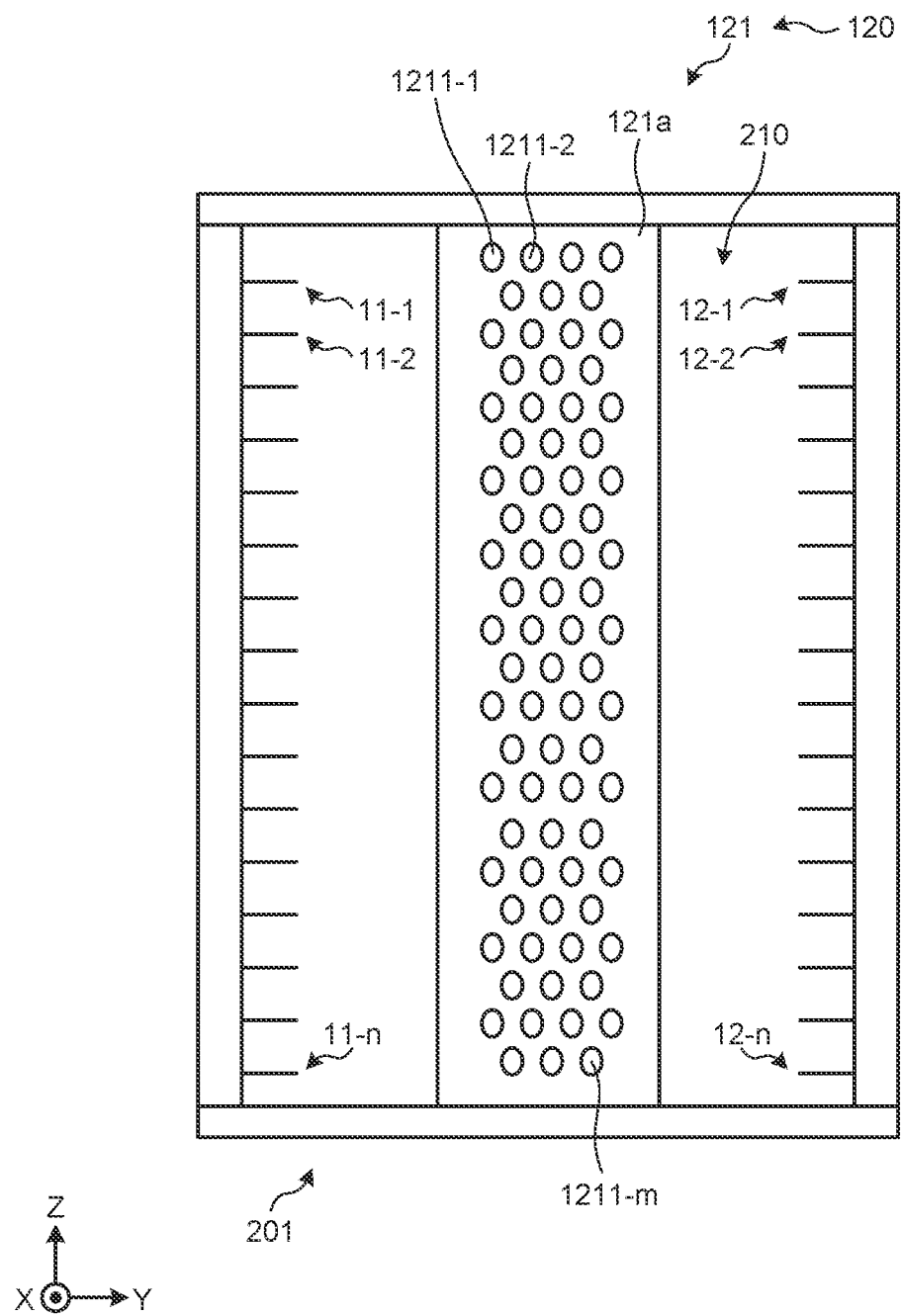
FIG. 14 is a front view illustrating a configuration of the substrate storage apparatus according to the third embodiment.

As illustrated in FIG. 14, the substrate storage apparatus 201 includes a storage unit 210 in place of the storage unit 110 (see FIG. 11). FIG. 14 is a YZ-front view illustrating a configuration of the substrate storage apparatus 201.

In the storage unit 210, the plurality of plates 11 have substantially equal Z-direction intervals between the adjacent plates 11 from the −Z-side toward the +Z-side. The plurality of plates 12 have substantially equal Z-direction intervals between the adjacent plates 12 from the −Z-side toward the +Z-side. The plurality of holes 1211-1 to 1211-$m$ of the wall portion 121$a$ are arranged so as to be aligned with the plurality of plates 11 and 12 in the XY-plane direction that intersects the Z-direction and so that an arrangement density thereof in the Z-direction is substantially even.

In the substrate storage apparatus 201, storage positions of the substrates W are shifted in the Z-direction by the conveyance robot RB3. A shift amount may be each of the Z-direction intervals between the adjacent plates 11 or 12. According to this, the substrate storage apparatus 201 stores one substrate W sequentially on the plurality of plates 11 and 12. That is, in the storage unit 210 of the substrate storage apparatus 201, one substrate W is mounted sequentially on the surfaces of the plurality of plates 11 and 12. For the plurality of substrates W, the storage unit 210 may perform in parallel such processing for mounting one substrate W sequentially on the plurality of plates 11 and 12.

When attention is paid to one substrate W, the substrate W is mounted on the surfaces of the plates 11-1 and 12-1, the position of the substrate W is changed to cause the substrate W to be mounted on the surfaces of the plates 11-2 and 12-2, . . . , and the position of the substrate W is changed to cause the substrate W to be mounted on the plates 11-$n$ and 12-$n$. That is, the storage unit 210 stores the substrate W on the plates 11-1 and 12-1, stores the substrates W on the plates 11-2 and 12-2, . . . , and stores the substrate W on the plates 11-$n$ and 12-$n$. Thereafter, the substrate W is unloaded from the surfaces of the plates 11-$n$ and 12-$n$ to the outside of the storage space 3.

Note that the number of arms AM in the conveyance robot RB3 may be smaller by the number (for example, one) corresponding to the shift amount than the number (n pieces) corresponding to the number of substrates W storable in the substrate storage apparatus 201. That is, the number of arms AM in the conveyance robot RB3 may be n−1.

Next, a description will be given of an operation of the substrate storage apparatus 201 with reference to FIGS. 15A to 20B. Each of FIGS. 15A, 15B, 16A, 16B, 17A, 17B, 18A, 18B, 19A, 19B, 20A and 20B is an XZ-cross sectional view illustrating the operation of the substrate storage apparatus 201.

In FIGS. 15A to 20B, the operation of the substrate storage apparatus 201, which is in accordance with the first sequence, is illustrated. In the first sequence, the substrate storage apparatus 201 stores each of the substrates W for a predetermined time. After the elapse of the predetermined time, the substrate W is unloaded. Established is n=3i (i is an arbitrary integer of two or more). FIGS. 15A to 20B illustrate the case where the predetermined time is three minutes, the substrate W is loaded every minute, and the position of the substrate W is changed every 1/i minutes. In FIGS. 15A to 20B, for simplification, the illustration of arrows indicating the airflow and the illustration of the plates 11 and 12 are omitted.

For example, it is assumed that there is formed a flow (downflow) of gas, which, by the fans FA1, goes from the +Z-side region of the conveyance chamber CH1 toward the −Z-side thereof and blows into the storage space 3.

Figure 15A:
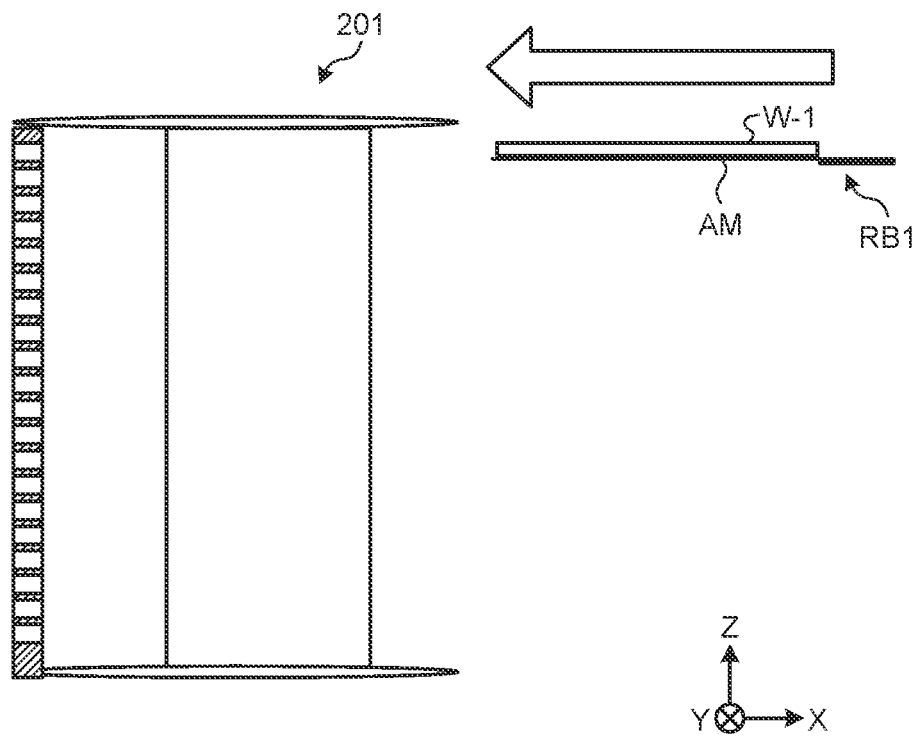
FIGS. 15A and 15B are cross-sectional views illustrating an operation of the substrate storage apparatus according to the third embodiment.
Figure 15B:
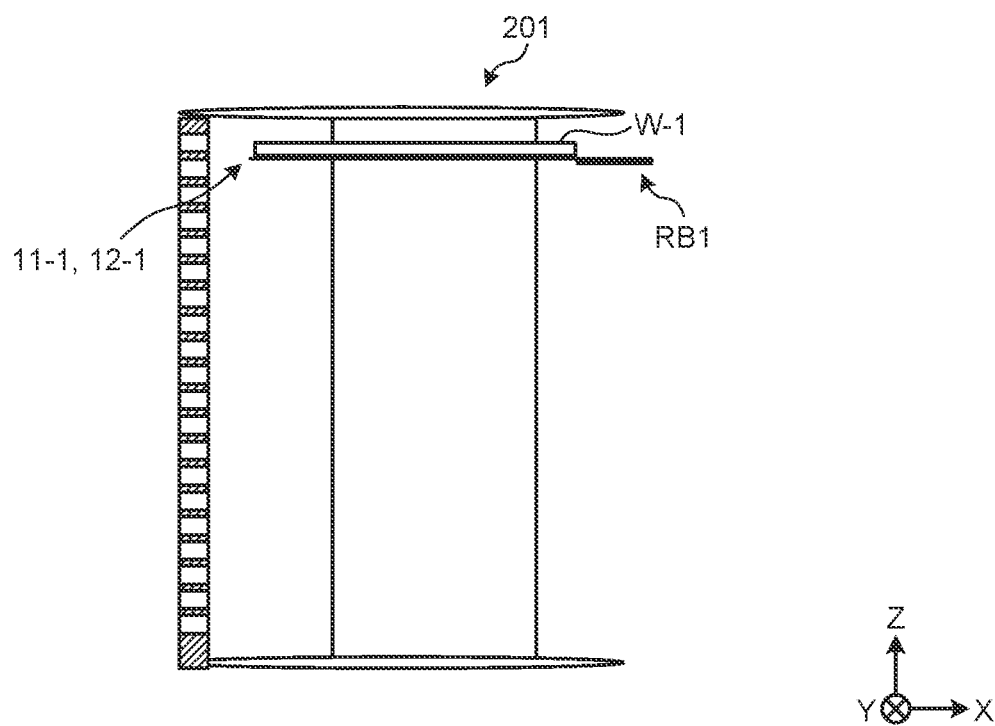

As illustrated in FIG. 15A, the conveyance robot RB1 loads the substrate W-1 from the load lock module LL1 via the conveyance chamber CH1 into the storage space 3 in a state of grasping the substrate W-1 by the arm AM. As illustrated in FIG. 15B, the conveyance robot RB1 releases the grasp of the substrate W-1 in the vicinities of the plate 11-1 and the plate 12-1, and mounts the substrate W-1 on the surfaces of the plate 11-1 and the plate 12-1. That is, the substrate storage apparatus 201 stores the substrate W-1 on the Z-positions of the plate 11-1 and the plate 12-1. The conveyance robot RB1 retreats from the storage space 3.

Figure 16A:
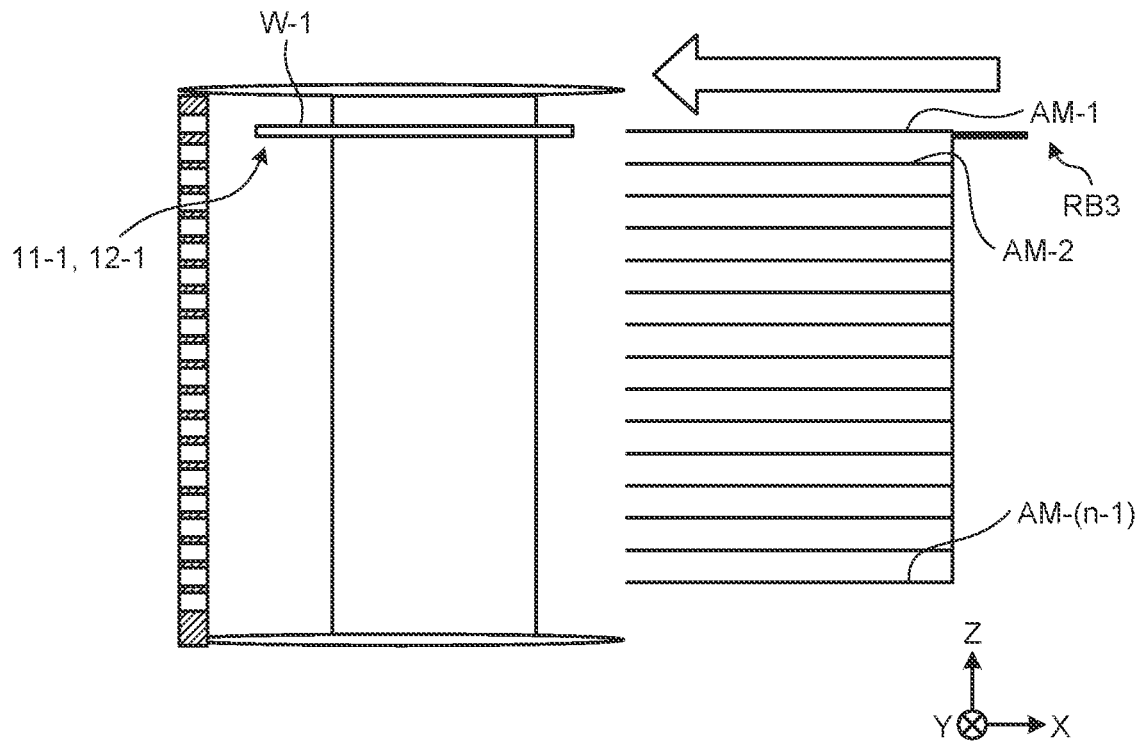
FIGS. 16A and 16B are cross-sectional views illustrating the operation of the substrate storage apparatus according to the third embodiment.
Figure 16B:
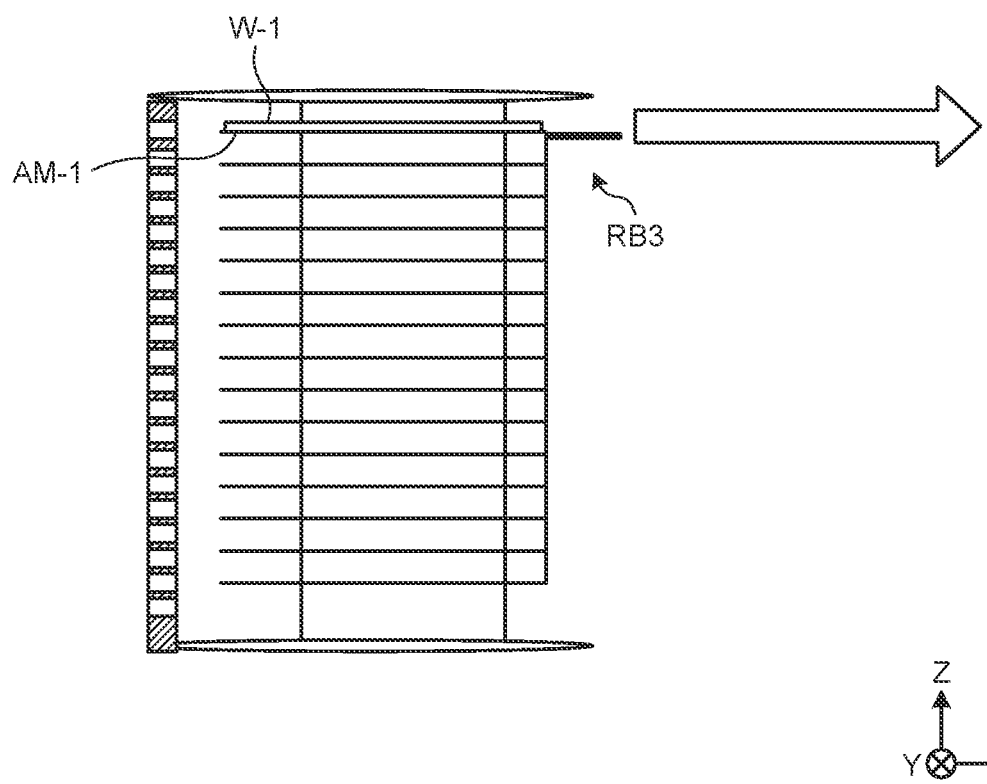

At timing when the position of the substrate W is changed, as illustrated in FIG. 16A, the conveyance robot RB3 causes the Z-position of the arm AM-1 to correspond to the Z-positions of the plates 11-1 and 12-1. The conveyance robot RB3 moves the respective arms AM-1 to AM-(n–1) in the –X-direction, and as illustrated in FIG. 16B, positions the arm AM-1 to the vicinities of the plate 11-1 and the plate 12-1. The conveyance robot RB3 grasps the substrate W-1 by the arm AM-1.

Figure 17A:
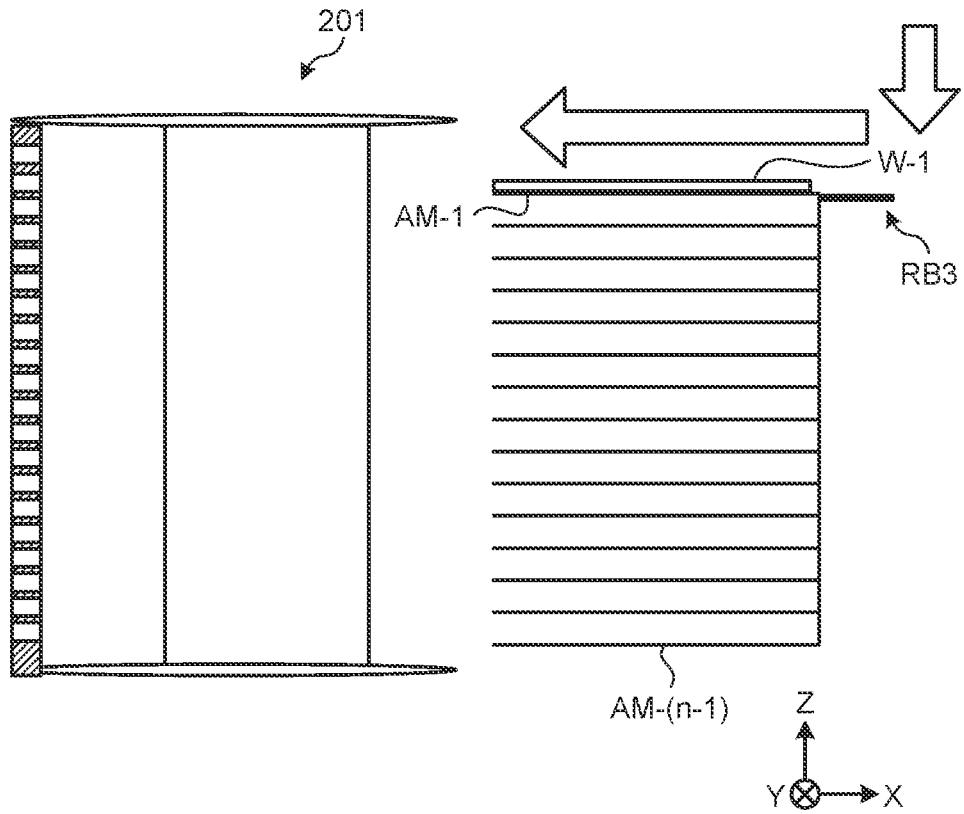
FIGS. 17A and 17B are cross-sectional views illustrating the operation of the substrate storage apparatus according to the third embodiment.

The conveyance robot RB3 moves the respective arms AM-1 to AM-(n–1) in the +X-direction in a state of grasping the substrate W-1 by the arm AM-1. As illustrated in FIG. 17A, the conveyance robot RB3 moves the respective arms AM-1 to AM-(n–1) in the –Z-direction, and, causes the Z-position of the arm AM-1 to correspond to the Z-positions of the plates 11-2 and 12-2.

Figure 17B:
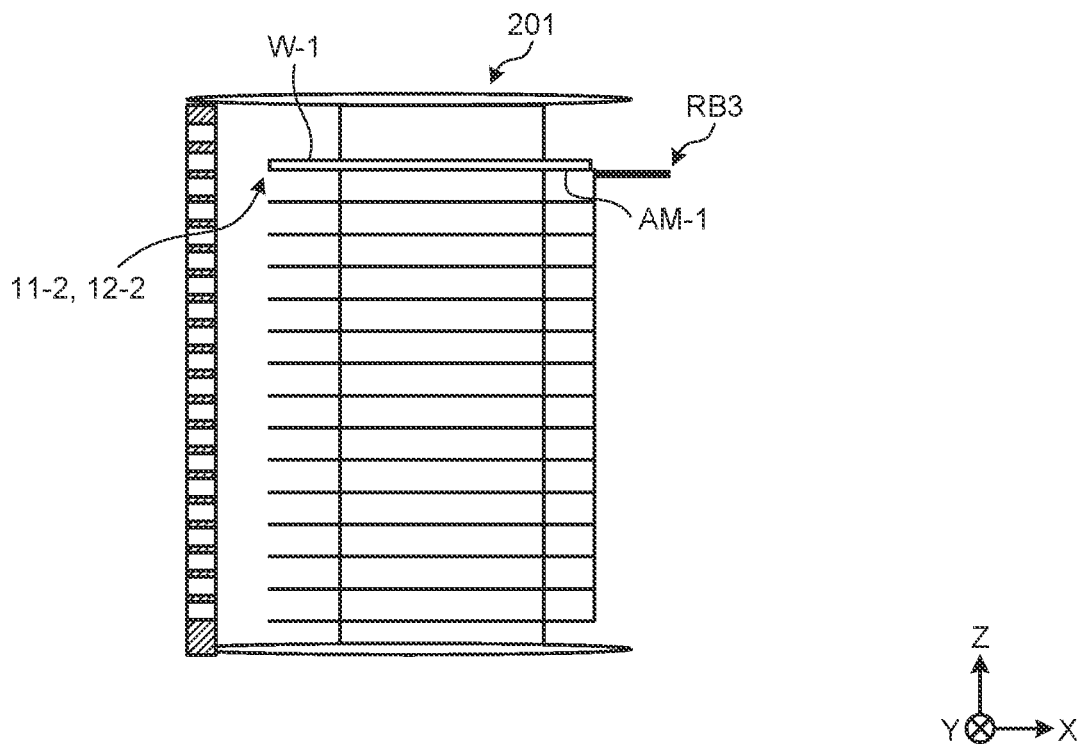

The conveyance robot RB3 moves the respective arms AM-1 to AM-(n–1) in the –X-direction, and as illustrated in FIG. 17B, positions the arm AM-1 to the vicinities of the plate 11-2 and the plate 12-2. The conveyance robot RB3 releases the grasp of the substrate W-1 by the arm AM-1, and mounts the substrate W-1 on the surfaces of the plate 11-2 and the plate 12-2. That is, the substrate storage apparatus 201 stores the substrate W-1 on the Z-positions of the plate 11-2 and the plate 12-2. The conveyance robot RB3 retreats from the storage space 3.

The conveyance robot RB3 repeats operations similar to those in FIGS. 16A to 17B every 1/i minutes. In parallel to this, the conveyance robot RB1 repeats operations similar to those in FIGS. 15A and 15B every minute.

Thus, for example, in the substrate storage apparatus 201, the substrate W-1 is mounted on the surfaces of the plates 11-(n–1) and 12-(n–1), the substrate W-2 is mounted on the surfaces of the plates 11-(2i–1) and 12-(2i–1), and the substrate W-3 is mounted on the surfaces of the plates 11-(i–1) and 12-(i–1). That is, the storage unit 210 of the substrate storage apparatus 201 stores the substrate W-1 on the Z-positions of the plates 11-(n–1) and 12-(n–1), stores the substrate W-2 on the Z-positions of the plates 11-(2i–1) and 12-(2i–1), and stores the substrate W-3 on the Z-positions of the plates 11-(i–1) and 12-(i–1).

Figure 18A:
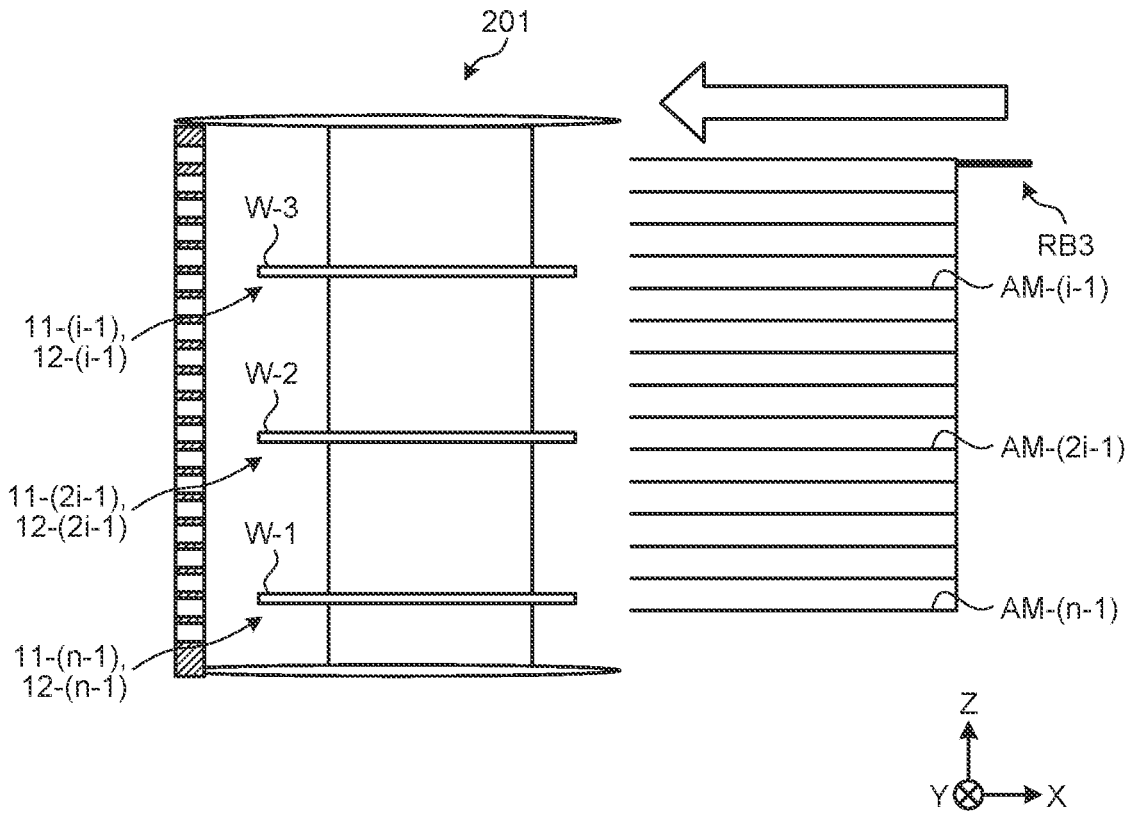
FIGS. 18A and 18B are cross-sectional views illustrating the operation of the substrate storage apparatus according to the third embodiment.

At timing when the positions of the substrates W are changed, as illustrated in FIG. 18A, the conveyance robot RB3 causes the Z-position of the arm AM-(i–1) to correspond to the Z-positions of the plates 11-(i–1) and 12-(i–1), causes the Z-position of the arm AM-(2i–1) to correspond to the Z-positions of the plates 11-(2i–1) and 12-(2i–1), and causes the Z-position of the arm AM-(n–1) to correspond to the Z-positions of the plates 11-(n–1) and 12-(n–1).

Figure 18B:
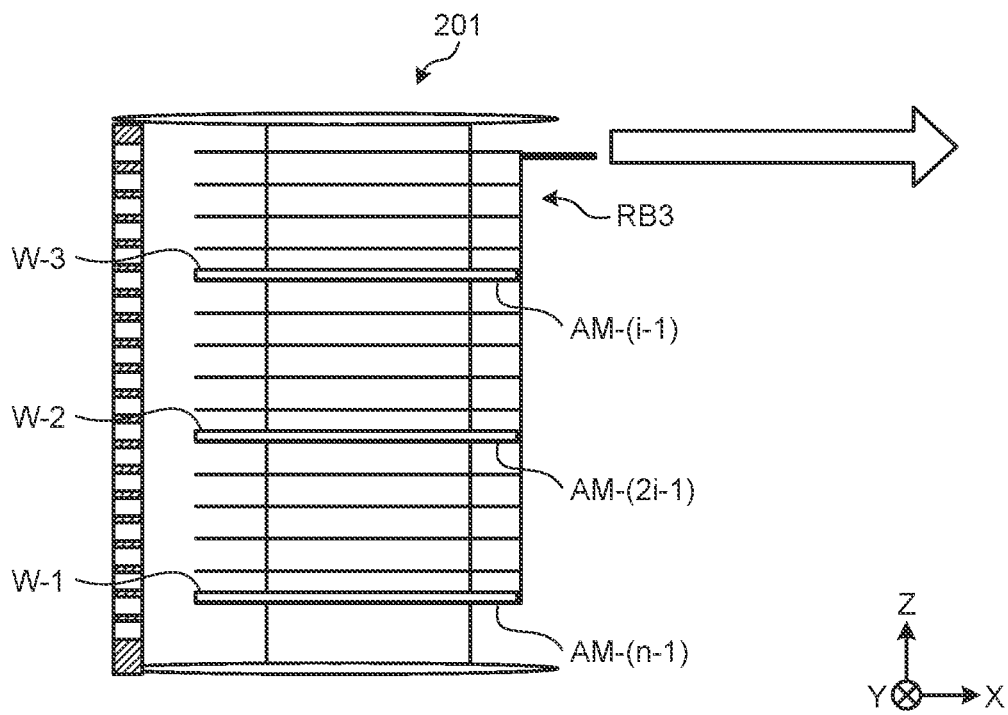

The conveyance robot RB3 moves the respective arms AM-1 to AM-(n–1) in the –X-direction, and as illustrated in FIG. 18B, positions the arm AM-(i–1) to the vicinities of the plate 11-(i–1) and the plate 12-(i–1), positions the arm AM-(2i–1) to the vicinities of the plate 11-(2i–1) and the plate 12-(2i–1), and positions the arm AM-(n–1) to the vicinities of the plate 11-(n–1) and the plate 12-(n–1). The conveyance robot RB3 grasps the substrate W-3 by the arm AM-(i–1), grasps the substrate W-2 by the arm (AM-(2i–1), and grasps the substrate W-1 by the arm AM-(n–1).

Figure 19A:
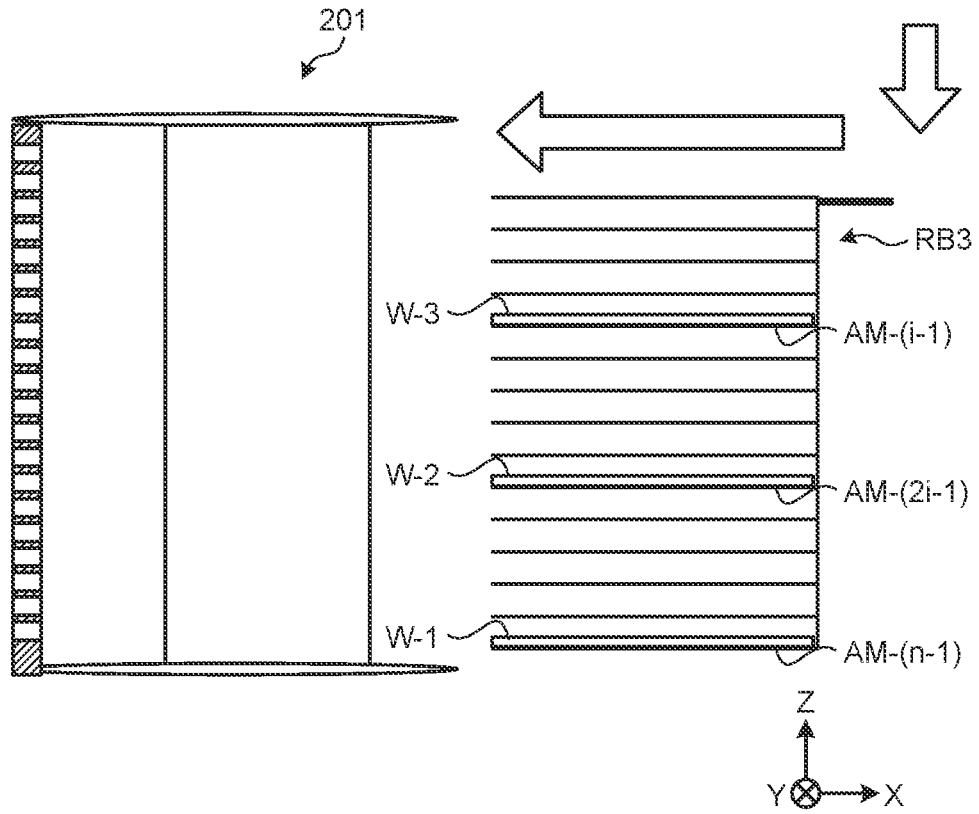
FIGS. 19A and 19B are cross-sectional views illustrating the operation of the substrate storage apparatus according to the third embodiment.

The conveyance robot RB3 moves the respective arms AM-1 to AM-(n–1) in the +X-direction in a state of grasping the substrates W-3, W-2 and W-1 by the arm AM-(i-1), AM-(2i–1) and AM-(n–1). As illustrated in FIG. 19A, the conveyance robot RB3 moves the respective arms AM-1 to AM-(n–1) in the –Z-direction, causes the Z-position of the arm AM-(i–1) to correspond to the Z-positions of the plates 11-i and 12-i, causes the Z-position of the arm AM-(2i–1) to correspond to the Z-positions of the plates 11-2i and 12-2i, and causes the Z-position of the arm AM-(n–1) to correspond to the Z-positions of the plates 11-n and 12-n.

Figure 19B:
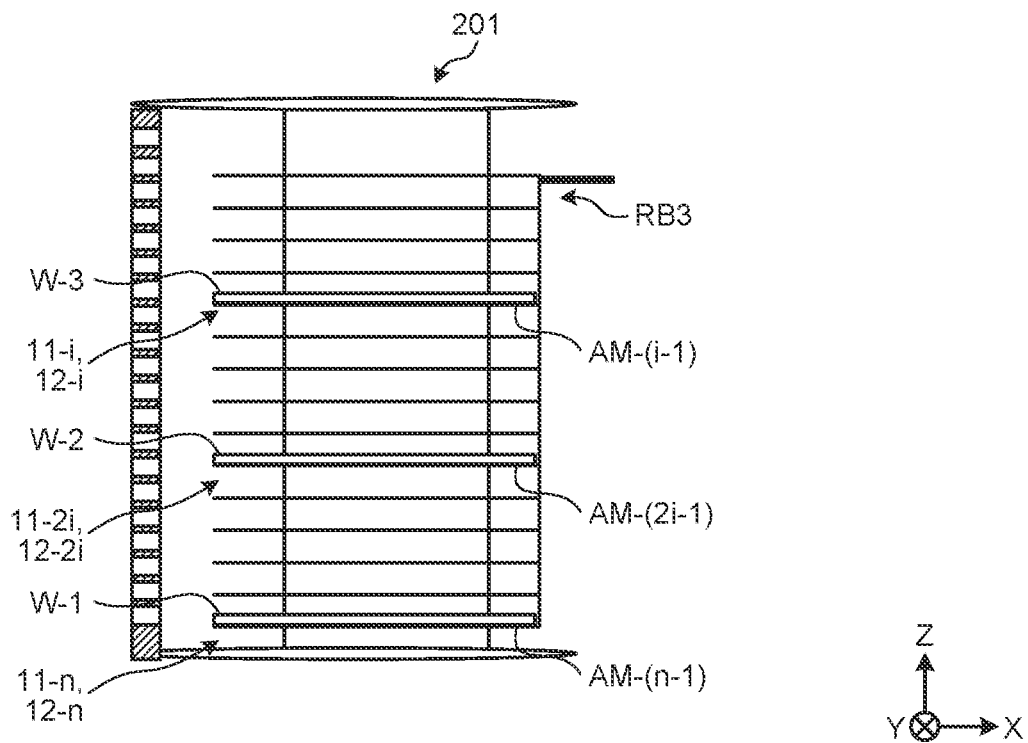

The conveyance robot RB3 moves the respective arms AM-1 to AM-(n–1) in the –X-direction, and as illustrated in FIG. 19B, positions the arm AM-(i–1) to the vicinities of the plates 11-i and 12-i, positions the arm AM-(2i–1) to the vicinities of the plate 11-2i and the plate 12-2i, and positions the arm AM-(n–1) to the vicinities of the plate 11-n and the plate 12-n. The conveyance robot RB3 releases the grasp of the substrate W-3 by the arm AM-(i–1), releases the grasp of the substrate W-2 by the arm AM-(2i–1), and releases the grasp of the substrate W-1 by the arm AM-(n–1). Thus, the conveyance robot RB3 mounts the substrate W-3 on the surfaces of the plate 11-i and the plate 12-i, mounts the substrate W-2 on the surfaces of the plate 11-2i and the plate 12-2i, and mounts the substrate W-1 on the surfaces of the plate 11-n and the plate 12-n. That is, the storage unit 210 of the substrate storage apparatus 201 stores the substrate W-1 on the Z-positions of the plates 11-n and 12-n, stores the substrate W-2 on the Z-positions of the plates 11-2i and 12-2i, and stores the substrate W-3 on the Z-positions of the plates 11-i and 12-i. The conveyance robot RB3 retreats from the storage space 3.

Figure 20A:
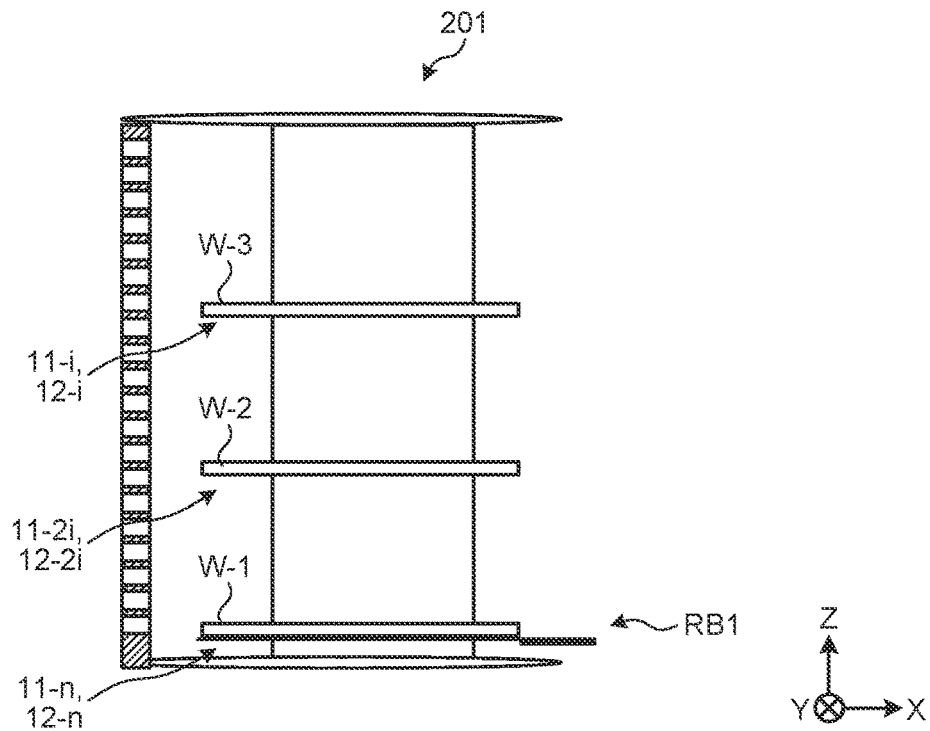
FIGS. 20A and 20B are cross-sectional views illustrating the operation of the substrate storage apparatus according to the third embodiment.
Figure 20B:
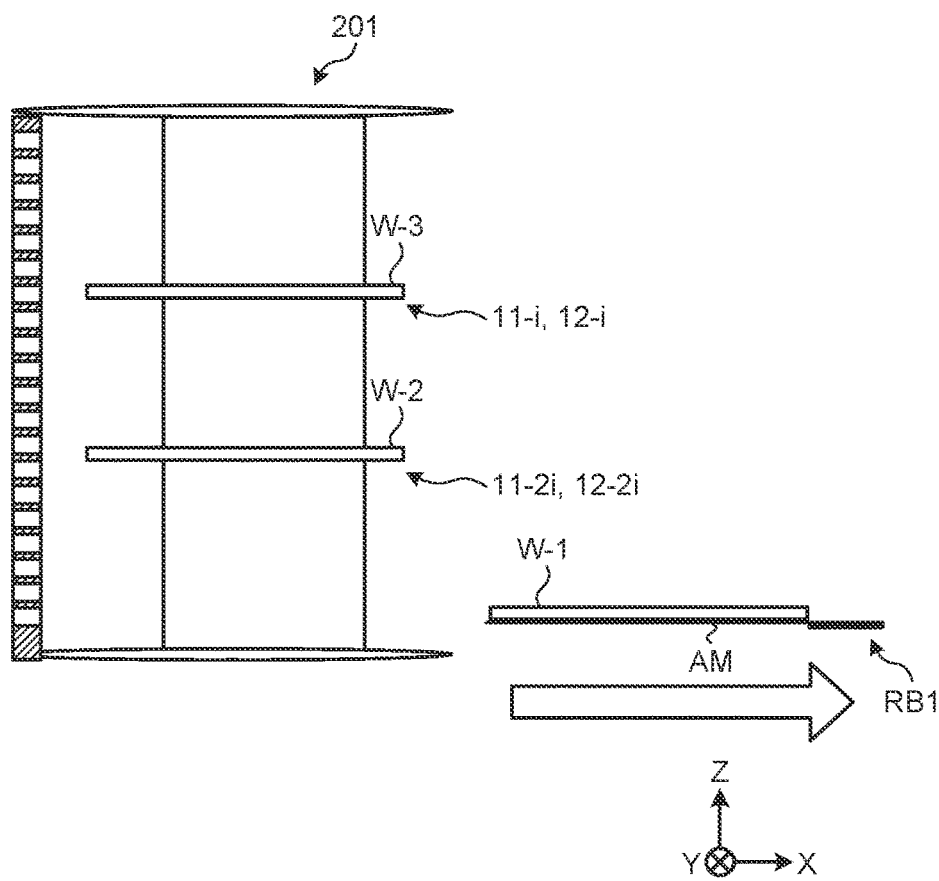

As illustrated in FIG. 20A, the conveyance robot RB1 positions the arm AM to the vicinities of the plate 11-n and the plate 12-n, and grasps the substrate W-1 by the arm AM. As illustrated in FIG. 20B, the conveyance robot RB1 retreats from the storage space 3 in a state of grasping the substrate W-1 by the arm AM. Thus, the substrate W-1 is unloaded from the storage space 3.

Herein, when the holes 1211 corresponding to the plurality of plates 11-1 to 11-n and 12-1 to 12-n are compared with one another, the holes 1211 corresponding to the +Z-side plates 11 and 12 are farther from the exhaust port EO (see FIG. 4). Therefore, airflow conductance of the holes 1211 corresponding to the +Z-side plates 11 and 12 is apt to be lower than airflow conductance of the holes 1211 corresponding to the –Z-side plates 11 and 12.

For this, in the substrate storage apparatus 201, after being loaded into the storage space 3 of the storage unit 210, each of the substrates W is stored sequentially on the respective plates 11-1 to 11-n and 12-1 to 12-n, and is unloaded from the storage space 3. That is, the storage unit 210 mounts one substrate W sequentially on the surfaces of the plurality of plates 11-1 to 11-n and 12-1 to 12-n. Thus, an influence of the difference between the airflow conductances corresponding to the storage positions can be reduced. That is, the substrate storage apparatus 201 can equate the cleaning abilities for the plurality of stored substrates W.

As described above, in the third embodiment, in the substrate storage apparatus 201, the storage unit 210 mounts one substrate W sequentially on the surfaces of the plurality of plates 11-1 to 11-n and 12-1 to 12-n. This is performed for each of the plurality of substrates W-1 to W-n. Thus, the influence of the difference between the airflow conductances corresponding to the storage positions can be reduced between the plurality of substrates W-1 to W-n. Hence, the plurality of substrates W-1 to W-n stored in the substrate storage apparatus 201 can be cleaned evenly.

Note that, in the substrate storage apparatus 201, the storage unit 210 may store one substrate W sequentially for a substantially equal time every N pieces of the plates 11 and 12 in the plurality of plates 11 and 12. N is an arbitrary integer of two or more. In this case, the number of arms AM in the conveyance robot RB3 may be smaller by the number (for example, N) of shift amount than the number (n pieces) of substrates W storable in the substrate storage apparatus 201.

Fourth Embodiment

Next, a description will be given of a substrate storage apparatus 301 according to a fourth embodiment. A description will be mainly given below of different portions from those in the first embodiment to the third embodiment.

In the first embodiment and the second embodiment, it is illustrated that the configurations of the substrate storage apparatuses 1 and 101 are devised, and in the third embodiment, it is illustrated that the operation of the substrate storage apparatus 201 is devised. In the fourth embodiment, it is illustrated that the configuration and operation of the substrate storage apparatus 301 are devised.

Figure 21:
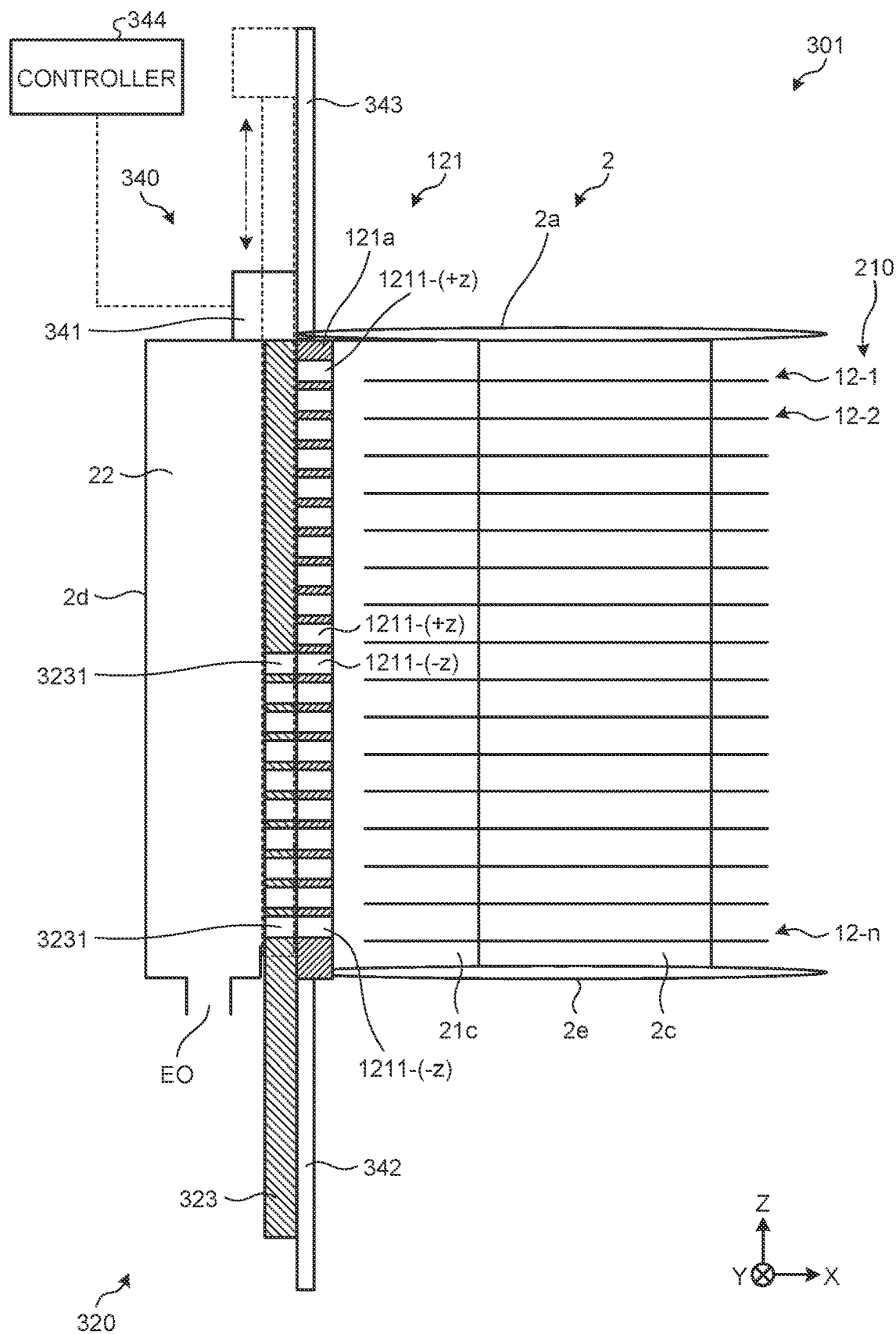
FIG. 21 is a cross-sectional view illustrating a configuration of a substrate storage apparatus according to a fourth embodiment.

Specifically, the substrate storage apparatus 301 can be configured as illustrated in FIG. 21. FIG. 21 is an XZ-cross-sectional view illustrating the configuration of the substrate storage apparatus 301. FIG. 21 illustrates an XZ-cross-section when the substrate storage apparatus 301 is cut in the XZ-direction at the Y-position that passes through the holes 1211 of the wall portion 121.

The substrate storage apparatus 301 includes an exhaust unit 320 in place of the exhaust unit 120 (see FIG. 14), and further includes a drive unit 340. The exhaust unit 320 further includes a wall portion 323. The wall portion 323 intervenes between the wall portion 121 and the exhaust passage 22. The wall portion 323 is disposed between the wall portion 121 and the side wall 2d in the X-direction, and extends along the side wall 2d. The wall portion 323 has a Y-direction width corresponding to the wall portion 121a. The wall portion 323 extends in the YZ-direction. A Z-direction length of the wall portion 323 is longer than a Z-direction length of the wall portion 121a. A partial region on a +X-side surface of the wall portion 323 is disposed close to the −X-side surface of the wall portion 121a.

The wall portion 323 includes a plurality of holes 3231. The plurality of holes 3231 are arrayed in the Z-direction to correspond to the plurality of plates 11 and 12. Each of the holes 3231 penetrates the wall portion 323 from the +X-side to the −X-side.

The plurality of holes 3231 correspond to a part of the plurality of holes 1211 (see FIG. 14) in the wall portion 121a, and are arrayed in the YZ-direction in the wall portion 323. For example, when a plurality of holes on the +Z-side among the plurality of holes 1211 in the wall portion 121a are denoted as 1211-(+z), and a plurality of holes on the −Z-side thereamong are denoted as 1211-(−z), the plurality of holes 3231 correspond to the plurality of holes 1211-(+z), and correspond to the plurality of holes 1211-(−z). YZ-positions of the plurality of holes 3231 correspond to the YZ-positions of the plurality of holes 1211-(+z), and correspond to the YZ-positions of the plurality of holes 1211-(−z).

The drive unit 340 is capable of changing a relative position between the wall portion 121 and the wall portion 323 in the Z-direction. When the wall portion 121 is fixed to the cabinet 2 of the substrate storage apparatus 301, the drive unit 340 drives the wall portion 323 in the Z-direction, thereby changing the relative position between the wall portion 121 and the wall portion 323 in the Z-direction. The drive unit 340 controls the wall portion 323 to a Z-position indicated by a solid line, and can thereby cause YZ-positions of the plurality of holes 3231 to substantially coincide with YZ-positions of the plurality of holes 1211-(−z). The drive unit 340 controls the wall portion 323 to a Z-position indicated by a dotted line, and can thereby cause the YZ-positions of the plurality of holes 3231 to substantially coincide with YZ-positions of the plurality of holes 1211-(+z).

The drive unit 340 includes a drive motor 341, a rail 342, a rail 343 and a controller 344. The drive motor 341 includes a pinion fixed to the wall portion 323, and is capable of rotating the pinion. The pinion is fixed to a +Z-side end of the wall portion 323. In addition, the pinion may cause teeth thereof to mesh with teeth of a rack on the rail 343, and may be capable of running on the rack on the rail 343. The rail 342 is disposed at a position of being able to come close to the wall portion 323 on the −Z-side of the wall portion 121, extends in the Z-direction, and has a +Z-side end fixed to the bottom wall 2e or the −Z-side end of the wall portion 121. The rail 343 is disposed at a position of being able to come close to the wall portion 323 on the +Z-side of the wall portion 121, extends in the Z-direction, and has a −Z-side end fixed to the upper wall 2a or the +Z-side end of the wall portion 121. The rail 343 includes a rack corresponding to the pinion of the drive motor 341. The controller 344 controls the drive motor 341, thus, as indicated by dot-dashed-line arrows in FIG. 21, making it possible to slide the wall portion 323 in the Z-direction along the rail 342 and the rail 343.

Note that, though not illustrated, structures which correspond to both of the +X-side surface of the wall portion 323 and the rails 342 and 343 and slidably fit thereto may be provided therebetween. Thus, the wall portion 323 can be stably slid in the Z-direction along the rail 342 and the rail 343.

Next, a description will be given of an operation of the substrate storage apparatus 301 with reference to FIGS. 22A and 22B. Each of FIGS. 22A and 22B is an XZ-cross-sectional view illustrating the operation of the substrate storage apparatus 301.

Figures 22A, 22B:
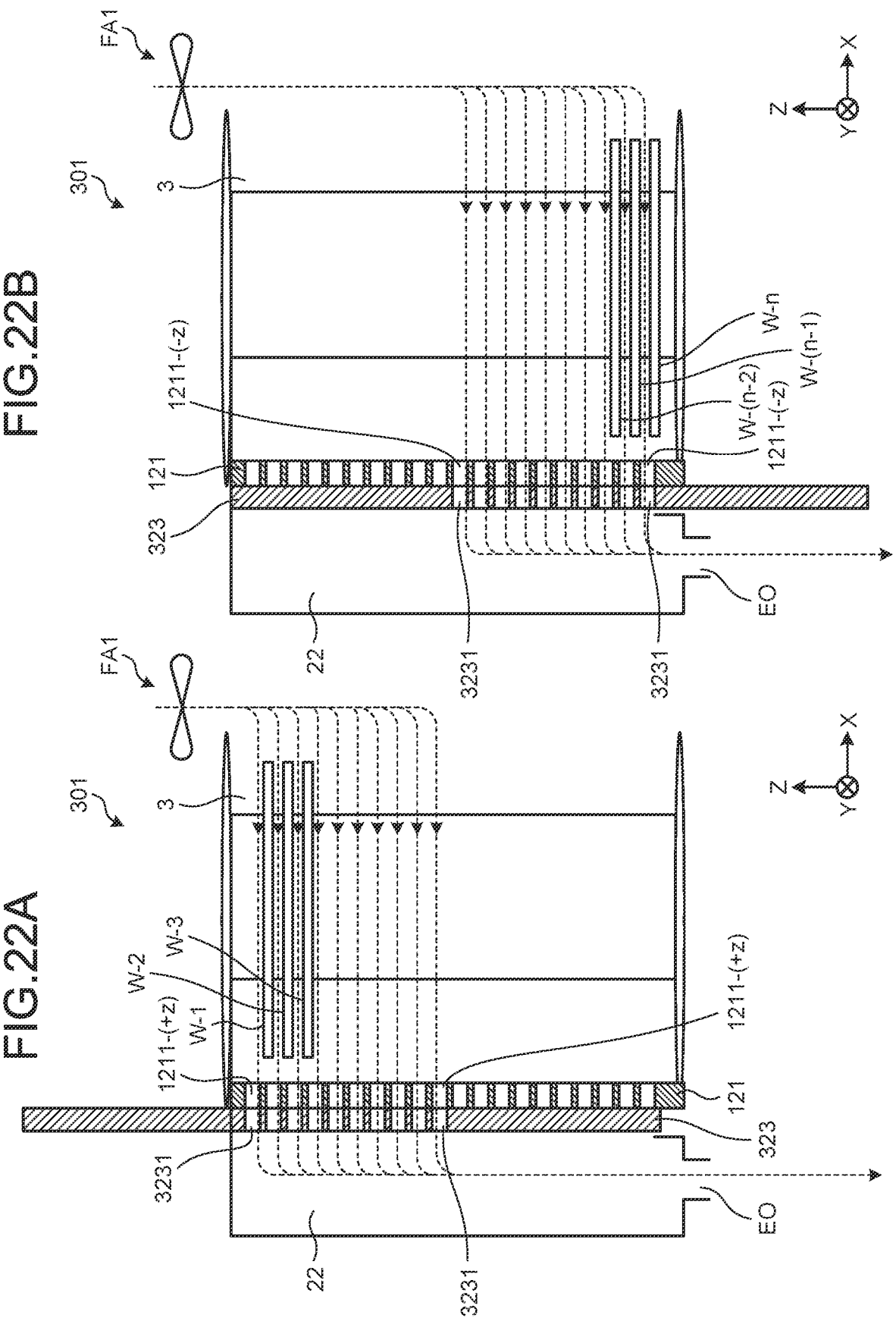
FIGS. 22A and 22B are cross-sectional views illustrating an operation of the substrate storage apparatus according to the fourth embodiment.

In FIGS. 22A and 22B, the operation of the substrate storage apparatus 301, which is in accordance with the first sequence, is illustrated. In the first sequence, the substrate storage apparatus 301 stores each of the substrates W for a predetermined time. After the elapse of the predetermined time, the substrate W is unloaded. FIGS. 22A and 22B illustrate the case where the predetermined time is three minutes and the substrate W is loaded every minute.

For example, it is assumed that there is formed a flow (downflow) of gas, which, by the fans FA1, goes from the +Z-side region of the conveyance chamber CH1 toward the −Z-side thereof and blows into the storage space 3.

At timing immediately before the substrate W begins to be loaded into the +Z-side region in the storage space 3, the drive unit 340 places the wall portion 121 and the wall portion 323 at a first relative position in the Z-direction. The first relative position indicates such a relationship between the Z-position of the wall portion 121 and the Z-position of the wall portion 323 that an airflow is selectively formed in the +Z-side region in the storage space 3. For example, in a state in which the Z-position of the wall portion 121 is fixed, the drive unit 340 controls the wall portion 323 to be, as illustrated in FIG. 22A, at the Z-position indicated by a dotted line in FIG. 21.

Thus, as illustrated in FIG. 22A, the drive unit 340 causes the YZ-positions of the plurality of holes 3231 to substantially coincide with the YZ-positions of the plurality of holes 1211-(+z), and causes the plurality of holes 3231 and the plurality of holes 1211-(+z) to communicate with each other, and to communicate with the exhaust passage 22. As a result, as indicated by dotted-line arrows in FIG. 22A, there is formed an airflow that blows from the +Z-side into the storage space 3, passes through the Z-positions of the +Z-side plates 11-1 to 11-$k$ and 12-1 to 12-$k$, and flows from the plurality of holes 1211-(+z) and the plurality of holes 3231 via the exhaust passage 22 to the exhaust port EO. This airflow is selectively formed in the plurality of holes 1211-(+z) on the +Z-side among the plurality of holes 1211 in the wall portion 121. The plurality of holes 1211-(−z) on the −Z-side are closed by the wall portion 323, and are not caused to communicate with the exhaust passage 22, and the formation of the airflow that passes in the horizontal direction (e.g., X-direction) through the plurality of holes 1211-(−z) and the plurality of holes 3231 is blocked.

In this state, the conveyance robot RB1 loads the substrate W-1 from the load lock module LL1 via the conveyance chamber CH1 into the storage space 3, and mounts the substrate W-1 on the surfaces of the plate 11-1 and the plate 12-1. The conveyance robot RB1 loads the substrate W-2 from the load lock module LL1 via the conveyance chamber CH1 into the storage space 3, and mounts the substrate W-2 on the surfaces of the plate 11-2 and the plate 12-2. The conveyance robot RB1 loads the substrate W-3 from the load lock module LL1 via the conveyance chamber CH1 into the storage space 3, and mounts the substrate W-3 on the surfaces of the plate 11-3 and the plate 12-3.

At timing immediately before the substrate W-1 is unloaded, the substrate storage apparatus 301 stores the substrates W-1 to W-3. At this time, as indicated by the dotted-line arrows in FIG. 22A, the respective substrates W-1 to W-3 can be cleaned by the airflow that passes through the vicinities of the surfaces thereof.

Thereafter, at timing immediately before the substrate W begins to be loaded into the −Z-side region in the storage space 3, the drive unit 340 places the wall portion 121 and the wall portion 323 at a second relative position in the Z-direction. The second relative position indicates such a relationship between the Z-position of the wall portion 121 and the Z-position of the wall portion 323 that an airflow is selectively formed in the −Z-side region in the storage space 3. For example, in a state in which the Z-position of the wall portion 121 is fixed, the drive unit 340 controls the wall portion 323 to be, as illustrated in FIG. 22B, at the Z-position indicated by a solid line in FIG. 21.

Thus, as illustrated in FIG. 22B, the drive unit 340 causes the YZ-positions of the plurality of holes 3231 to substantially coincide with the YZ-positions of the plurality of holes 1211-(−z), and causes the plurality of holes 3231 and the plurality of holes 1211-(−z) to communicate with each other, and to communicate with the exhaust passage 22. As a result, as indicated by dotted-line arrows in FIG. 22B, there is formed an airflow that blows from the +Z-side into the storage space 3, passes through the Z-positions of the −Z-side plates 11-($k$+1) to 11-$n$ and 12-($k$+1) to 12-$n$, and flows from the plurality of holes 1211-(−z) and the plurality of holes 3231 via the exhaust passage 22 to the exhaust port EO. This airflow is selectively formed in the plurality of holes 1211-(−z) on the −Z-side among the plurality of holes 1211 in the wall portion 121. The plurality of holes 1211-(+z) on the +Z-side are closed by the wall portion 323, and are not caused to communicate with the exhaust passage 22, and the formation of the airflow that passes in the horizontal direction (e.g., X-direction) through the plurality of holes 1211-(+z) and the plurality of holes 3231 is blocked.

In this state, the conveyance robot RB1 loads the substrate W-($n$−2) from the load lock module LL1 via the conveyance chamber CH1 into the storage space 3, and mounts the substrate W-($n$−2) on the surfaces of the plate 11-($n$−2) and the plate 12-($n$−2). The conveyance robot RB1 loads the substrate W-($n$−1) from the load lock module LL1 via the conveyance chamber CH1 into the storage space 3, and mounts the substrate W-($n$−1) on the surfaces of the plate 11-($n$−1) and the plate 12-($n$−1). The conveyance robot RB1 loads the substrate W-$n$ from the load lock module LL1 via the conveyance chamber CH1 into the storage space 3, and mounts the substrate W-$n$ on the surfaces of the plate 11-$n$ and the plate 12-$n$. At this time, as indicated by the dotted-line arrows in FIG. 22B, the respective substrates W-($n$−2) to W-$n$ can be cleaned by the airflow that passes through the vicinities of the surfaces thereof.

Herein, when the state illustrated in FIG. 22A and the state illustrated in FIG. 22B are compared with each other, the number of holes caused to communicate with the exhaust passage 22 is substantially equal therebetween, and the conductances of the airflows by the holes 1211 and the holes 3231 are roughly equal to each other. Thus, amounts of the airflows which blow into the storage space 3, then pass through the holes 1211 and the holes 3231 and flow into the exhaust passage 22 are roughly equal to each other. As a result, a cleaning ability when the substrates W-1 to W-3 are stored in the +Z-side region in the storage space 3 and a cleaning ability when the substrates W-($n$−2) to W-$n$ are stored in the −Z-side region in the storage space 3 can be roughly equated to each other.

As described above, in the fourth embodiment, in the substrate storage apparatus 301, the storage space 3 is divided into a plurality of regions (for example, the +Z-side region and the −Z-side region) in the Z-direction, and the airflow is formed in each of the plurality of regions in a time division manner. Thus, the influence of the difference between the airflow conductances corresponding to the storage positions can be reduced between the plurality of substrates W-1 to W-$n$. Hence, the plurality of substrates W-1 to W-$n$ stored in the substrate storage apparatus 301 can be cleaned evenly.

Note that, in the configuration in FIG. 21, a configuration in which the wall portion 323 and the wall portion 121 are interchanged with each other may be adopted. In this case, the upper wall 2$a$ and the bottom wall 2$e$ are provided with openings for allowing the wall portion 323 to pass therethrough in the Z-direction, though the fact that the wall portion 121 is fixed to the upper wall 2$a$ and the bottom wall 2$e$ is similar to the fourth embodiment. Also with this configuration, it is possible to achieve an operation similar to that in FIGS. 22A and 22B.

In the configuration in FIG. 21, there are illustrated the configuration and the operation in which the storage space 3 is divided into two regions which are the +Z-side and the −Z-side and the holes 1211 caused to communicate with the exhaust passage 22 among the plurality of holes 1211 are switched in two stages. However, the number of switching stages may be three or more. For example, when the number of switching stages is three, the plurality of holes 1211 are divided into three groups in the Z-direction, and an array of the plurality of holes 3211 in the wall portion 323 is configured to correspond to each of the groups. Also with this configuration, the airflow may be formed in each of the plurality of regions in a time division manner.

While certain embodiments have been described, these embodiments have been presented by way of example only, and are not intended to limit the scope of the inventions.

Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A substrate storage apparatus comprising:
a storage unit including a plurality of plates; and
an exhaust unit including an exhaust passage and a wall portion, the exhaust passage communicating with an exhaust port, the wall portion intervening between the storage unit and the exhaust passage, and the wall portion including a plurality of slit holes,
wherein
the plurality of plates protrude inward from a cabinet in the storage unit, plates among the plurality of plates being capable of mounting a substrate,
the plurality of plates are arrayed in a vertical direction,
the plurality of slit holes are arrayed in the vertical direction to correspond to the plurality of plates,
each of the plurality of slit holes extends in a horizontal direction and penetrates the wall portion,
the plurality of slit holes include a first slit hole and a second slit hole, the second slit hole being closer to the exhaust port than the first slit hole, and
a distance in the vertical direction between the second slit hole and a plate corresponding to the second slit hole among the plurality of plates is smaller than a distance in the vertical direction between the first slit hole and a plate corresponding to the first slit hole among the plurality of plates.

2. The substrate storage apparatus according to claim 1, wherein,
the plurality of plates includes
a plurality of one-side-plates provided on one side of the plurality of slit holes in the horizontal direction in the cabinet in the storage unit, and
a plurality of another-side-plates provided on another side of the plurality of slit holes in the horizontal direction in the cabinet in the storage unit,
the plurality of one-side-plates and the plurality of another-side-plates correspond to each other, and are individually arrayed in the vertical direction, and
the plurality of slit holes are arrayed in the vertical direction to correspond to the plurality of one-side-plates and the plurality of another-side-plates.

3. The substrate storage apparatus according to claim 2, wherein
the plurality of slit holes include a first slit hole and a second slit hole, the second slit hole being closer to the exhaust port than the first slit hole, and
when viewed from a direction perpendicular to the wall portion, an overlapping area of the second slit hole and a substrate mounted on the one-side-plate and the another-side-plate which correspond to the second slit hole among the plurality of plates is larger than an overlapping area of the first slit hole and a substrate mounted on the one-side-plate and the another-side-plate which correspond to the first slit hole among the plurality of plates.

4. The substrate storage apparatus according to claim 2, wherein
a side opposite to the wall portion of the cabinet in the storage unit is opened.

5. A substrate storage apparatus comprising:
a storage unit including a plurality of plates; and
an exhaust unit including an exhaust passage and a wall portion, the exhaust passage communicating with an exhaust port, the wall portion intervening between the storage unit and the exhaust passage, and the wall portion including a plurality of holes, wherein
the plurality of plates protrude inward from a cabinet in the storage unit, plates among the plurality of plates being capable of mounting a substrate,
the plurality of plates are arrayed in a vertical direction, and are aligned with the plurality of holes in a horizontal direction,
each of the plurality of holes penetrates the wall portion,
the plurality of plates include a first plate and a second plate, the second plate being closer to the exhaust port than the first plate, and
an interval between the first plate and a plate adjacent to the first plate in the vertical direction among the plurality of plates is wider than an interval between the second plate and a plate adjacent to the second plate in the vertical direction among the plurality of plates.

6. The substrate storage apparatus according to claim 5, wherein,
when viewed from a direction perpendicular to the wall portion, a total opening area of holes among the plurality of holes in a region between a height position of the first plate and a height position of the plate adjacent to the first plate is larger than a total opening area of holes among the plurality of holes in a region between a height position of the second plate and a height position of the plate adjacent to the second plate.

7. The substrate storage apparatus according to claim 5, wherein
a side opposite to the wall portion of the cabinet in the storage unit is opened.

8. The substrate storage apparatus according to claim 5, wherein
the plurality of holes are two-dimensionally arrayed in the wall portion, and have a substantially even arrangement density in the vertical direction, and
intervals between neighboring plates in the vertical direction among the plurality of plates are widened gradually or in stages as going away from the exhaust port along the vertical direction.

9. The substrate storage apparatus according to claim 8, wherein,
when viewed from a direction perpendicular to the wall portion, a total opening area of holes among the plurality of holes in a region between height positions of two plates adjacent to each other in the vertical direction among the plurality of plates is increased gradually or in stages as going away from the exhaust port along the vertical direction.

10. A substrate processing system comprising:
a substrate storage apparatus; and
a first conveyance robot including a plurality of arms,
wherein
the substrate storage apparatus comprises:
a storage unit including a plurality of plates; and
an exhaust unit including an exhaust passage and a wall portion, the exhaust passage communicating with an exhaust port, the wall portion intervening between the storage unit and the exhaust passage, and the wall portion including a plurality of holes,
the plurality of plates protrude inward from a cabinet in the storage unit, the plurality of plates are arrayed in a vertical direction, and are aligned with the plurality of holes in a horizontal direction, each of the plurality of holes penetrates the wall portion, in the storage unit, one substrate is mounted sequentially on the plurality of plates, the storage unit stores a plurality of substrates of which number is smaller than a number of the plurality of plates arrayed in the vertical direction, in the storage unit, shift processings are performed in parallel for the plurality of substrates, in each shift processing the one substrate being mounted sequentially on the plurality of plates, and the first conveyance robot shifts, in parallel, mounting positions of the plurality of substrates in the storage unit by the plurality of arms.

11. The substrate processing system according to claim 10, wherein
a first number of arms included in the first conveyance robot is smaller than a second number of plurality of plates arrayed in the vertical direction.

12. The substrate processing system according to claim 11, further comprising
a second conveyance robot including one arm, wherein
the first conveyance robot shifts, by the plurality of arms, the mounting positions of the plurality of substrates in the storage unit by a number that is a difference between the second number and the first number, and
the second conveyance robot discharges, by the one arm, a substrate among the plurality of substrates that completes the shift processing from the storage unit.

* * * * *